US012775863B2

(12) United States Patent
Smelyanskiy et al.

(10) Patent No.: US 12,775,863 B2
(45) Date of Patent: Oct. 27, 2026

(54) CASCADE PROTOCOL FOR iSWAP GATE IN A TWO-QUBIT SYSTEM

(71) Applicant: Google LLC, Mountain View, CA (US)

(72) Inventors: Vadim Smelyanskiy, Mountain View, CA (US); Andre Petukhov, Rapid City, SD (US); Rami Barends, San Diego, CA (US); Sergio Boixo Castrillo, Rancho Palos Verdes, CA (US)

(73) Assignee: Google LLC, Mountain View, CA (US)

( * ) Notice: Subject to any disclaimer, the term of this patent is extended or adjusted under 35 U.S.C. 154(b) by 138 days.

(21) Appl. No.: 18/808,690

(22) Filed: Aug. 19, 2024

(65) Prior Publication Data

US 2025/0053837 A1 Feb. 13, 2025

Related U.S. Application Data

(63) Continuation of application No. 16/981,075, filed as application No. PCT/US2019/016032 on Jan. 31, 2019, now Pat. No. 12,067,457.

(Continued)

(51) Int. Cl.
*G06N 10/20* (2022.01)
*G06N 10/00* (2022.01)

(Continued)

(52) U.S. Cl.
CPC ............. *G06N 10/20* (2022.01); *G06N 10/00* (2019.01); *G06N 10/40* (2022.01); *G06N 10/60* (2022.01); *G06N 10/70* (2022.01); *H03K 19/195* (2013.01)

(58) Field of Classification Search
CPC ........ G06N 10/20; G06N 10/00; G06N 10/40; G06N 10/60; G06N 10/70; H03K 19/195

(Continued)

(56) References Cited

U.S. PATENT DOCUMENTS 7,498,832 B2 3/2009 Baumgardner et al.
7,893,708 B2 2/2011 Baumgardner et al.

(Continued)

FOREIGN PATENT DOCUMENTS

WO WO-2020106312 A1 * 5/2020 ............. G06N 10/00
WO WO-2025117552 A1 * 6/2025 ............. G06N 10/40

OTHER PUBLICATIONS

Barends et al., "Superconducting quantum circuits at the surface code threshold for fault tolerance," Nature, Apr. 2014, 508(7497): 15 pages.

(Continued)

*Primary Examiner* — Arnold M Kinkead
(74) *Attorney, Agent, or Firm* — Fish & Richardson P.C.

(57) ABSTRACT

Methods, systems and apparatus for implementing iSWAP quantum logic gates between a first qubit and a second qubit. In one aspect, a method includes implementing a cascade schedule that defines a trajectory of a detuning between a frequency of the first qubit and a frequency of the second qubit. Implementing the cascade schedule includes: during a first stage, adiabatically driving detuning between the frequency of the first qubit and the frequency of the second qubit through a first avoided crossing in a leakage channel; during a second stage, driving detuning between the frequency of the first qubit and the frequency of the second qubit through a second avoided crossing in a swap channel; during a third stage, evolving the first qubit and second qubit; during a fourth stage, implementing the second stage in reverse order; and during a fifth stage, implementing the first stage in reverse order.

20 Claims, 10 Drawing Sheets

100

1000

Related U.S. Application Data

(60) Provisional application No. 62/769,426, filed on Nov. 19, 2018.

(51) Int. Cl.

| | |
|---|---|
| ***G06N 10/40*** | (2022.01) |
| ***G06N 10/60*** | (2022.01) |
| ***G06N 10/70*** | (2022.01) |
| ***H03K 19/195*** | (2006.01) |

(58) Field of Classification Search
USPC .............................................. 326/1, 2, 3, 4, 7
See application file for complete search history.

(56) References Cited

U.S. PATENT DOCUMENTS

| | | | | |
|---|---|---|---|---|
| 10,352,992 | B1 | 7/2019 | Zeng et al. | |
| 11,106,980 | B2 | 8/2021 | Kapit | |
| 2017/0104493 | A1 | 4/2017 | Goto | |
| 2023/0342651 | A1* | 10/2023 | Miao | G06N 10/40 |
| 2024/0394584 | A1* | 11/2024 | Gidney | G06N 10/70 |

OTHER PUBLICATIONS

Berkley et al., "Entangled macroscopic quantum states in two superconducting qubits," Science, Jun. 2003, 300(5625): 12 pages.
Berry et al., "Histories of adiabatic quantum transitions," Proceedings of the Royal Society of London, Mathematical and Physical Sciences, May 1990, 429(1876):61-72.
Denchev et al., "What is the computational value of finite-range tunneling?" Physical Review X, Aug. 2016, 6(3):031015:1-19.
Didier et al., "Analytical modeling of parametrically-modulated transmon qubits," CoRR, Submitted on Jan. 2018, arXiv:1706.06566v2, 16 pages.
Ghosh et al., "High-fidelity CZ gate for resonator-based superconducting quantum computers," CoRR, Submitted on Jan. 2013, arXiv:1301.1719v1, 22 pages.
International Preliminary Report on Patentability in International Application No. PCT/US2019/016032, mailed on Jun. 3, 2021, 13 pages.
International Search Report and Written Opinion in International Appln. No. PCT/US2019/016032, mailed on Aug. 20, 2019, 20 pages.
McKay et al., "A Universal Gate for Fixed-Frequency Qubits via a Tunable Bus" CoRR, Submitted on Dec. 2016, arXiv:1604.03076v3, 10 pages.
Neill et al., "A blueprint for demonstrating quantum supremacy with superconducting qubits," Science, Apr. 2018, 360(6385): 22 pages.
Nielsen et al., "A simple formula for the average gate fidelity of a quantum dynamical operation," CoRR, Submitted on May 2002, arXiv:quant-ph/0205035v2, 3 pages.
Notice of Allowance in Canadian Appln. No. 3,095,106, mailed on Mar. 3, 2023, 1 page.
Office Action in Canadian Appln. No. 3,095,106, mailed on Nov. 8, 2021, 3 pages.
Office Action in European Appln. No. 19706075.9, mailed on Jul. 2, 2024, 10 pages.
Rabi et al., "Use of rotating coordinates in magnetic resonance problems," Reviews of Modern Physics, Apr. 1954, 26(2):167-171.
Roland et al., "Quantum search by local adiabatic evolution," CoRR, Submitted on Jul. 2001, arXiv:quant-ph/0107015v1, 4 pages.
Rosen et al., "Double Stern-Gerlach experiment and related collision phenomena," Physical Review, May 1932, 40(4):502-507.
Roth et al., "Analysis of a parametrically driven exchange-type (iSwap) and a two-photon (bSWAP) interactions between superconducting qubits" CoRR, Submitted on Aug. 2017, arXiv:1708.02090v1, 10 pages.
Spiteri et al., "Quantum control for high-fidelity muti-qubit gates" New Journal of Physics, May 2018, 20(11):113009: 9 pages.
Strauch et al., "Quantum logic gates for coupled superconducting phase qubits," Phys Rev Lett., Oct. 2003, 91(16):167005:1-4.

* cited by examiner

CASCADE PROTOCOL FOR iSWAP GATE IN A TWO-QUBIT SYSTEM

CROSS-REFERENCE TO RELATED APPLICATION

This application is a continuation application and claims priority under 35 U.S.C. § 120 to U.S. patent application Ser. No. 16/981,075, now U.S. Pat. No. 12,067,457, filed Sep. 15, 2020, which is a National Stage Application under 35 U.S.C. § 371 and claims the benefit of International Application No. PCT/US2019/016032, filed Jan. 31, 2019, which claims priority to U.S. Application No. 62/769,426, filed Nov. 19, 2018. The foregoing applications are incorporated herein by reference in their entirety.

BACKGROUND

This specification relates to signal processing, quantum information processing and condensed matter physics.

SUMMARY

This specification describes technologies for implementing high fidelity iSWAP logic gates in quantum computers.

In general, one innovative aspect of the subject matter described in this specification can be implemented in a method for implementing an iSWAP quantum logic gate between a first qubit and a second qubit, the method comprising: implementing a cascade schedule that defines a trajectory of a detuning between a frequency of the first qubit and a frequency of the second qubit, comprising: during a first stage, adiabatically driving detuning between the frequency of the first qubit and the frequency of the second qubit through a first avoided crossing in a leakage channel; during a second stage, driving detuning between the frequency of the first qubit and the frequency of the second qubit through a second avoided crossing in a swap channel; during a third stage, evolving the first qubit and second qubit; during a fourth stage, implementing the second stage in reverse order; and during a fifth stage, implementing the first stage in reverse order.

Other implementations of this aspect include corresponding classical or quantum computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the cascade schedule satisfies a local adiabatic evolution condition. The local adiabatic evolution condition may be given by $\langle \Psi_g(t) | \partial_t \Psi_e(t) \rangle = \text{const} \cdot \omega_g(t)$ or $\partial_t \theta(t) = \text{const}$, where $\Psi_g(t)$ and $\Psi_e(t)$ represent instantaneous adiabatic eigenstates of an effective Hamiltonian describing the leakage channel, $\theta(t)$ represents the control angle, and $\partial_g(t) = \sqrt{(\in(t) - \eta_1)^2 + 8g^2}$ represents a time dependent gap for the Hamiltonian describing the leakage channel, with $\in(t)$ representing the detuning between the frequency of the first qubit and the frequency of the second qubit, $\eta_1$ representing an anharmonicity parameter of the first qubit, and g representing interqubit interaction strength.

In some implementations the probability that the cascade schedule incurs a leakage error is proportional to $e^{-2\sqrt{2}g \cdot t_p}$ with g representing the interqubit interaction strength and $t_p$ representing a total duration of the iSWAP gate.

In some implementations the cascade schedule synchronizes minimal errors in the swap channel and leakage channel.

In some implementations the first qubit and second qubit comprise capacitively coupled Xmon qubits.

The leakage channel may comprise a manifold spanned by the computational state 11 and two non-computational states 02 and 20, and wherein driving detuning between the frequency of the first qubit and the frequency of the second qubit through a first avoided crossing in a leakage channel comprises driving detuning between the frequency of the first qubit and the frequency of the second qubit through state 11-20 resonance.

The swap channel may comprise a manifold spanned by the computational states 10 and 01, and wherein driving detuning between the frequency of the first qubit and the frequency of the second qubit through a second avoided crossing in a swap channel comprises driving detuning between the frequency of the first qubit and the frequency of the second qubit through state 10-01 resonance.

In some implementations implementing the second stage in reverse order comprises driving detuning between the frequency of the first qubit and the frequency of the second qubit to achieve a complete population swap between the qubit states 10 and 01.

In some implementations the control angle comprises an angle between an effective magnetic field and the z-axis on a Bloch sphere of a system comprising the first qubit and the second qubit.

In some implementations the method may further comprise generating the cascade schedule, comprising: defining a trapezoidal ramp function in laboratory time; generating a polynomial expansion of the waveform for the control angle in terms of the generated trapezoidal ramp function; generating an initial schedule for driving the detuning between the frequency of the first qubit and the frequency of the second qubit using the generated polynomial expansion of the waveform for the control angle; obtaining one or more solutions in the swap channel; determining the probability of an error in the leakage channel; and adjusting the initial schedule for driving the detuning by synchronizing the one or more solutions in the swap channel and the probability of an error in the leakage channel, comprising: selecting a solution in the swap channel that, when combined with the probability of an error in the leakage channel, achieves a predetermined swap gate fidelity; and applying values of parameters in the selected solution to the initial schedule for driving the detuning to generate the cascade schedule.

In some implementations the method may further comprise adjusting parameter values of the cascade schedule using gate fidelity as a fitness function.

In some implementations the method may further comprise performing hardware testing and randomized benchmarking techniques to adjust the generated cascade schedule.

In some implementations the trapezoidal ramp function is a function of maximum control angle, pulse duration, length of upward ramp, and length of downward ramp.

In some implementations the trapezoidal ramp function takes values that are less than or equal to one.

In some implementations coefficients of the polynomial expansion sum to one.

In some implementations generating the initial schedule optionally further comprises applying a Gaussian filter.

In some implementations generating the initial schedule comprises parameterizing the detuning as $\epsilon(t)=\mu+2g\cdot\lambda\cot[\Theta(t,\{c\})]$ with $\mu$ representing shift, $\lambda$ representing scaling, g representing interqubit interaction strength, $\Theta$ representing the generated polynomial expansion and c representing a set of two or more variational parameters.

In general, another innovative aspect of the subject matter described in this specification can be implemented by an apparatus comprising a first qubit, a second qubit coupled to the first qubit, and control electronics comprising one or more control devices that tune the frequency of the first qubit and second qubit through application of respective control signals, wherein the control electronics are configured to implement the cascade schedule.

The subject matter described in this specification can be implemented in particular ways so as to realize one or more of the following advantages.

Execution of iSWAP gates using known protocols is slow and susceptible to leakage. In particular, applications of known techniques, such as simple trapezoidal pulses, introduce leakage errors. The presently described techniques for executing iSWAP gates provide fast and robust cascade schedules in the well-defined adiabatic regime that allow for a complete SWAP operation accompanied by a suppression of the Leakage error. For example, some implementations result in a suppression of the leakage error to below $10^{-4}$ in a very broad region of the gate times ~13 ns, which in turn leads to the estimated fidelity of the iSWAP gate exceeding 99.9999% and the fidelity loss due to a time error $\sim 5\cdot 10^{-5}$/ns in the vicinity of the optimal gate time $t_p=46.8$ ns.

In addition, the presently described techniques for executing iSWAP gates utilize only low-frequency control of detuning between qubit frequencies and are applicable to near term quantum computing architectures. Furthermore, since iSWAP gates are computationally hard to simulate using classical computers, the techniques described in this specification can facilitate state of the art experiments on quantum supremacy and an immediate impact on the field of quantum computing.

Implementation of the presently described techniques can reduce circuit design complexity and provide a path to scalable quantum computing architectures with high-fidelity multi-qubit gates. This, in turn, is an important step forward in achieving the long-term goal of developing an error-corrected quantum computer.

Details of one or more implementations of the subject matter of this specification are set forth in the accompanying drawings and the description below. Other features, aspects, and advantages of the subject matter will become apparent from the description, the drawings, and the claims.

DETAILED DESCRIPTION

Figure 1:
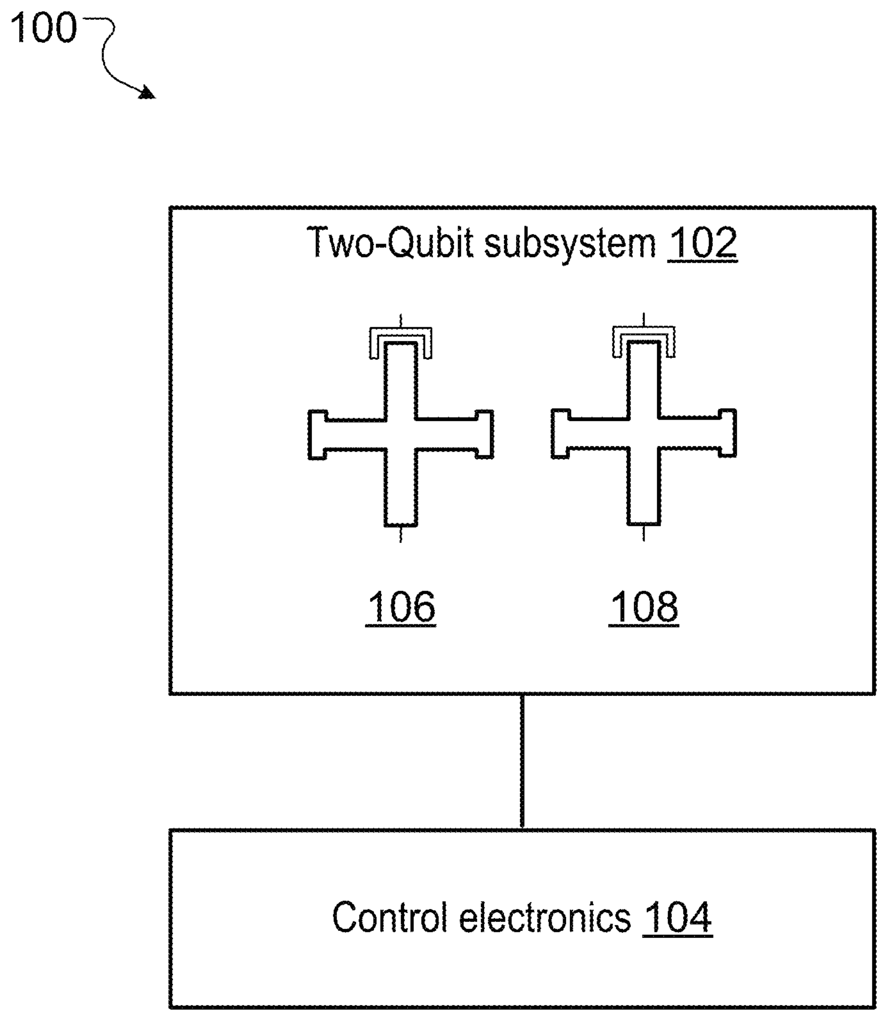
FIG. 1 depicts an example system for implementing iSWAP quantum logic gates.

A complete SWAP operation is a trace preserving, i.e., zero-leakage, transformation of a two-qubit system that enables complete population transfer between the states $|1\rangle\otimes|0\rangle$ and $|0\rangle\otimes|1\rangle$ (herein written as states 10 and 01) of the SWAP channel. Most generally, such an operation can be described by the unitary matrix $$U=\begin{pmatrix}1&0&0&0\\0&0&-ie^{i\theta_1}&0\\0&-ie^{i\theta_2}&0&0\\0&0&0&e^{i(\theta_1+\theta_2)}e^{i\phi}\end{pmatrix},$$

in the $(|00\rangle\ |01\rangle\ |10\rangle\ |11\rangle)$ basis, where $\phi$ represents a phase shift and angles $\theta_1$ and $\theta_2$ represent additional phases that can be corrected using single qubit z-rotations. Since these additional phases can be disregarded the SWAP and iSWAP gates can be described by the unitary matrices given in equation (1) below $$U_{swap}=\begin{pmatrix}1&0&0&0\\0&0&-1&0\\0&-1&0&0\\0&0&0&e^{i\phi}\end{pmatrix},\ U_{iswap}=\begin{pmatrix}1&0&0&0\\0&0&-i&0\\0&-i&0&0\\0&0&0&e^{i\phi}\end{pmatrix}\tag{1}$$

A complete population swap in the $|01\rangle$-$|10\rangle$ channel is referred to as a "perfect" swap operation, e.g., a swap operation as realized in theory. A near perfect or almost perfect swap operation is a swap operation with swap and leakage errors below a predetermined threshold, e.g., errors on the order of 10'. Other thresholds can also be used. For example, an error threshold can be selected based on a target fidelity specified by operators of the quantum computer device.

A challenging aspect of implementing SWAP or iSWAP gates is that the implementation should be consistent with generic quantum computing architectures, e.g., capacitively coupled qubits. In such architectures, qubit frequencies are parked in a so-called zigzag order, with frequencies of the nearest-neighbor qubits separated by ~1 GHz. After gate operations are applied to the qubits, the qubits are returned to their original parking positions. This makes some protocols, e.g., direct passage driving schedules of the Landau-Zener type, difficult or impossible to apply.

In addition, execution of a SWAP or iSWAP gate between a first qubit and second qubit by driving detuning ε(t) between energy levels of 10 and 01 states to zero (10-01 resonance), inevitably requires passing through a 11-20 leakage resonance first. As a result, a simple, trapezoidal-shape ramp function is not sufficient to reliably avoid leakage into non-computational sector of the Hilbert space. Existing hardware implementations of the SWAP or iSWAP gates also suffer from slow execution.

The techniques described in this specification address these challenges. In particular, this specification describes cascade protocols that can be applied to qubits to execute two-qubit gates such as SWAP or iSWAP gates with improved fidelities. The described cascade protocols utilize low-frequency control of detuning between qubit frequencies. More specifically, the described techniques employ a multi-parameter set of bias-controlled time protocols that are configured to suppress both errors in the SWAP and Leakage quantum channels at the end of gate execution. The shape and duration of the defined pulse is obtained using synchronization of motion in both channels, which results in an almost perfect SWAP operation accompanied by a reduction of probability to excite individual qubits into higher-frequency anharmonic states with both the swap and the leakage errors on the order of $10^{-5}$.

For convenience, the techniques described in this specification are presented with reference to implementing iSWAP gates. However, the techniques can be equally applied to implementing SWAP gates, as well as other gates that are based on SWAP operations, e.g., a $\sqrt{\text{SWAP}}$ gate.

Example Architecture

FIG. 1 depicts an example system 100 for implementing an iSWAP quantum logic gate on a two-qubit subsystem. The example system 100 is an example of a system implemented as part of a quantum computing device in which the systems, components and techniques described in this specification can be implemented.

The system 100 includes a two-qubit subsystem 102 in communication with control electronics 104. The two-qubit subsystem 102 includes a first qubit 106 and a second qubit 108. In some cases, as shown in FIG. 1, the first qubit 106 and second qubit 108 may be capacitively coupled Xmon qubits. For example, the first qubit 106 and second qubit 108 may be part of a linear chain of Xmon qubits included in a quantum computing device. However, in other cases the qubits may include flux qubits, phase qubits, or qubits with frequency interactions.

The first qubit 106 and second qubit 108 can be operated by adjusting the qubit frequencies, e.g., applying pulses generated by the control electronics 104 to the qubits. In cases where the first qubit 106 and the second qubit 108 are Xmon qubits, the qubit frequencies may be parked at a predetermined distance from one another, and in a zig-zag position with respect to other qubits that may be included in the quantum computing device.

A Hamiltonian describing the two qubits may be given by equation (2) below.

$$H = \sum_{i=1}^{2}\left[\omega_i(t) - \frac{1}{2}\eta_i\eta_i(n_i - 1)\right] + g\left(a_1^\dagger a_2 + a_2^\dagger a_1\right) \tag{2}$$

In equation (2), $\omega_i(t)$ represents time-dependent natural frequencies of the individual qubits, $\eta_i$ represents anharmonic detunings, g represents interqubit interaction strength, and $n_i$=

$$a_i^\dagger a_i$$

represents the number operator and $$a_i^\dagger, a_i$$

represent creation and annihilation operators. Without loss of generality, $\eta_1=\eta_2=\eta$, with typical values of $\eta=2\pi\times200$ MHz and $g=2\pi\times20$ MHz. Furthermore, it can be assumed that $\omega_2$=const and $\omega_1(t)=\omega_2+\varepsilon(t)$, where ε(t) represents the controlled detuning with the initial and final values $\varepsilon(-t_p/2)=\varepsilon(t_p/2)=2\pi\times1$ GHz, and $t_p$ represents the duration of a pulse applied to the qubit or qubits to implement a quantum logic gate (the gate time).

The Hamiltonian described in equation (2) conserves the total number of excitations M. Therefore, the 9×9 Hilbert space splits into 5 subspaces corresponding to M=0, 1 . . . , 4. Three of these subspaces with M=0, 1, 2 are relevant for the qubit operations driven by ε(t). These are the ground state 00, the SWAP manifold spanned by the computational states 10 and 01 and the leakage manifold spanned by the computational state 11 and two non-computational states 02 and 02. Sub-Hamiltonians $H_s(t)$ and $H_1(t)$ describing the SWAP channel and the leakage channel can therefore be expressed as $$H_s(t) = \omega_2 + \begin{pmatrix} \epsilon(t) & g \\ g & 0 \end{pmatrix} \tag{3}$$

$$H_l(t) = 2\omega_2 + \begin{pmatrix} \epsilon(t) & \sqrt{2}g & \sqrt{2}g \\ \sqrt{2}g & 2\epsilon(t) - \eta_1 & 0 \\ \sqrt{2}g & 0 & -\eta_2 \end{pmatrix}$$

All parameters except ε(t) of the Hamiltonian in equation (2) are static—they are not changed during execution of a quantum logic gate. Therefore, a schedule for implementing an iSWAP gate is achieved through parametrization of the detuning ε(t). The detuning may take the form $$\varepsilon(t) = \mu + 2g\cdot\lambda\cot\left[\vartheta\left(t, \{c\}\right)\right] \tag{4}$$

where the control angle ∂ depends on a set of variational parameters (c) containing M≥2 elements and the two additional parameters μ (shift) and λ (scaling) may be used in an extended adjustment/optimization procedure.

The parameters μ and λ define two limiting cases known in the art as non-adiabatic (μ=0, λ=1) and adiabatic ($\mu=\eta_1$, $\lambda=\sqrt{2}$ protocols, respectively. The differences between these two protocols are illustrated in FIGS. 2, 3A, 3B, 4A, 4B.

The control electronics 104 include control devices, e.g., arbitrary waveform generators, that can operate the first qubit 106 and second qubit 108. For example, the control electronics 104 may include control devices that tune the frequency of the first qubit 106 and second qubit 108 by applying control signals, e.g., voltage pulses, to the qubits through respective control lines.

In addition, the control devices may include measurement devices, e.g., readout resonators, that can perform measurements of the first qubit 106 and the second qubit 108 through respective qubit control lines. The control electronics 104 may be configured to store, display, and/or further process the results of measurements of the first qubit 106 and the second qubit 108.

In some implementations, the control electronics 104 may include a data processing apparatus and associated memory. The memory may include a computer program having instructions that, when executed by the data processing apparatus, cause the data processing apparatus to perform one or more functions described herein, such as applying a control signal to a qubit.

Figure 2:
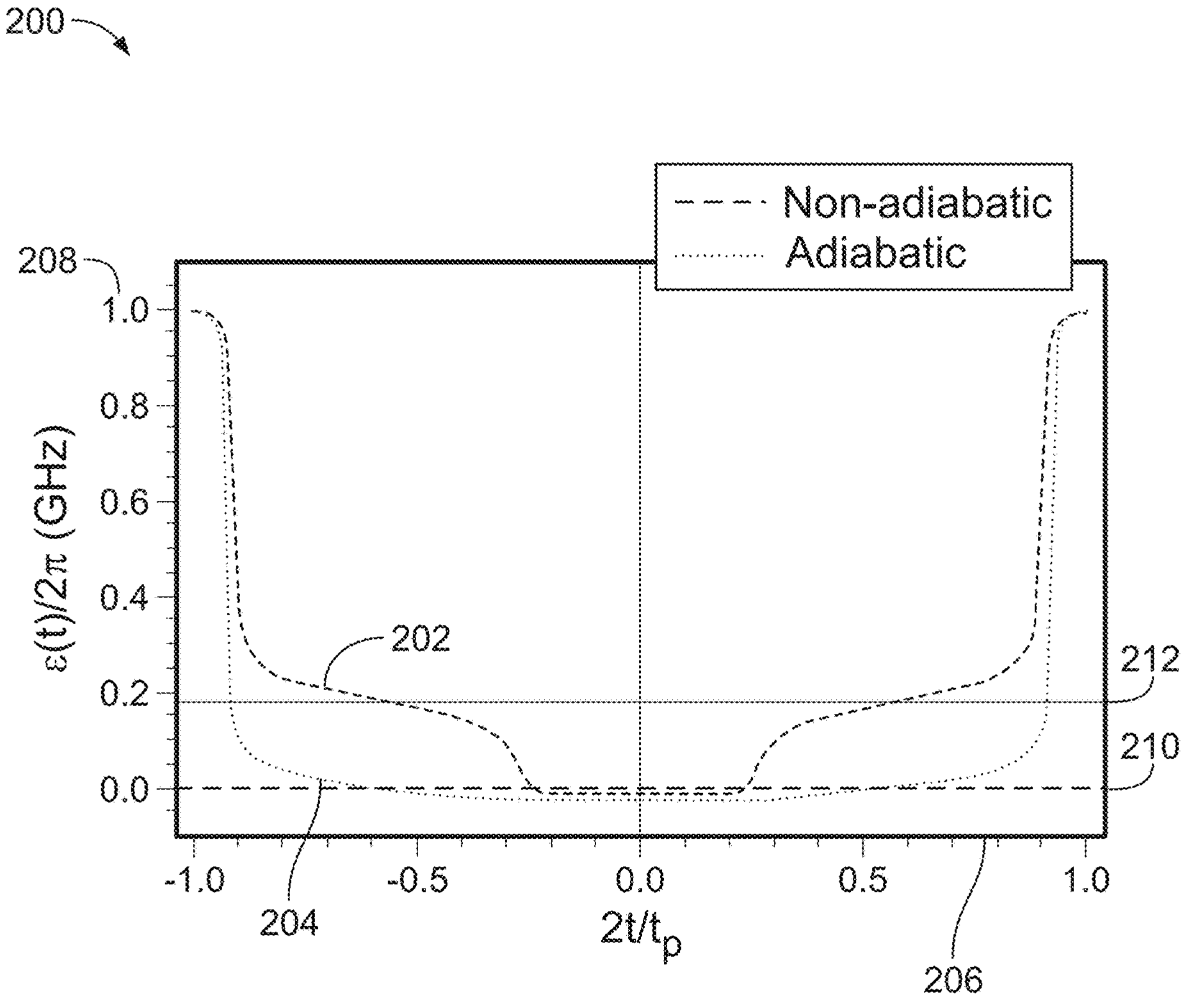
FIG. 2 shows a plot comparing an example adiabatic protocol for performing an iSWAP gate and an example non-adiabatic protocol for performing an iSWAP gate.

FIG. 2 shows a plot 200 comparing an example adiabatic protocol 202 for performing an iSWAP gate and an example non-adiabatic protocol 204 for performing an iSWAP gate. The plot includes a horizontal axis 206 representing dimensionless time $2t/t_p$ (where $t_p$ represents gate time) and a vertical axis 208 representing the detuning $\in(t)/2\pi$ measured in GHz. A first horizontal line 210 defines points of the level crossings in the SWAP channel. A second horizontal line 212 defines points of the level crossings in the leakage channel.

The distinction between the adiabatic protocol 202 and non-adiabatic protocol 204 is clear when the slopes of $\varepsilon(t)$ in the leakage channel 212 near 11-20 resonance (avoided level crossing), which occurs at $\varepsilon=\eta_1$, are compared. The non-adiabatic protocol 204 passes through the crossing 212 with very large velocity while the adiabatic protocol 202 has an inflection point corresponding to the minimal relative velocity of the energy levels. For the SWAP channel 210 the 10-01 resonance occurs at $\varepsilon=0$ and the behavior is the opposite, i.e., the non-adiabatic protocol 204 has an inflection point while the adiabatic protocol 202 drops almost vertically.

As shown in FIG. 2, the adiabatic protocol 202 takes the shape of a "cascade waterfall" that drops quickly and slows down near the horizontal line 212, i.e., it forms a "ledge" and then drops quickly and forms a ledge again. This behavior reflects the idea of a local adiabatic evolution for a system with several level crossings. In other words, the schedule behaves as a cascade, it slows down near each avoided crossing and accelerates again after passing it. The non-adiabatic protocol 204 goes straight down as a "plunge waterfall".

The energy eigenvalues of the Hamiltonian given by Equation (1) in the leakage channel and SWAP channel are shown in FIGS. 3A, 3B and FIGS. 4A, 4B for non-adiabatic and adiabatic protocols, respectively.

Figure 3A:
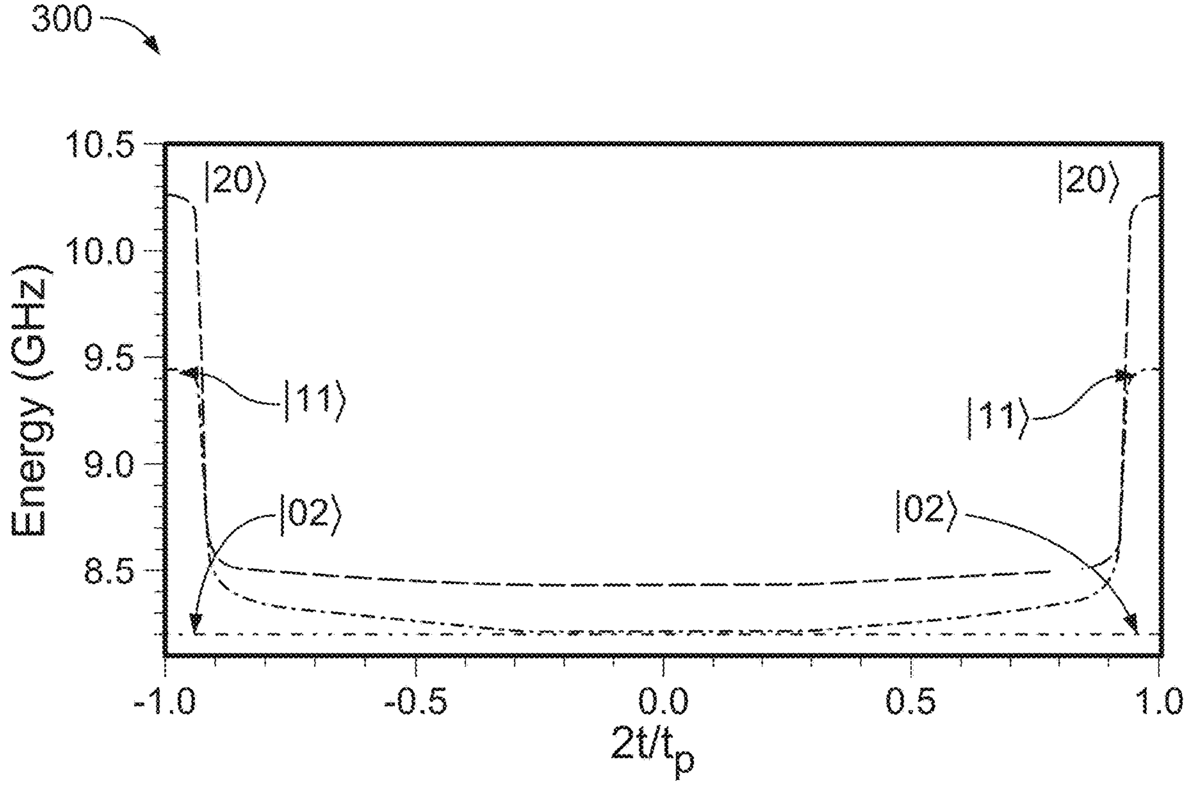
FIG. 3A shows a plot of the energy levels of two coupled Xmon qubits subject to a non-adiabatic protocol and in the leakage manifold.
Figure 3B:
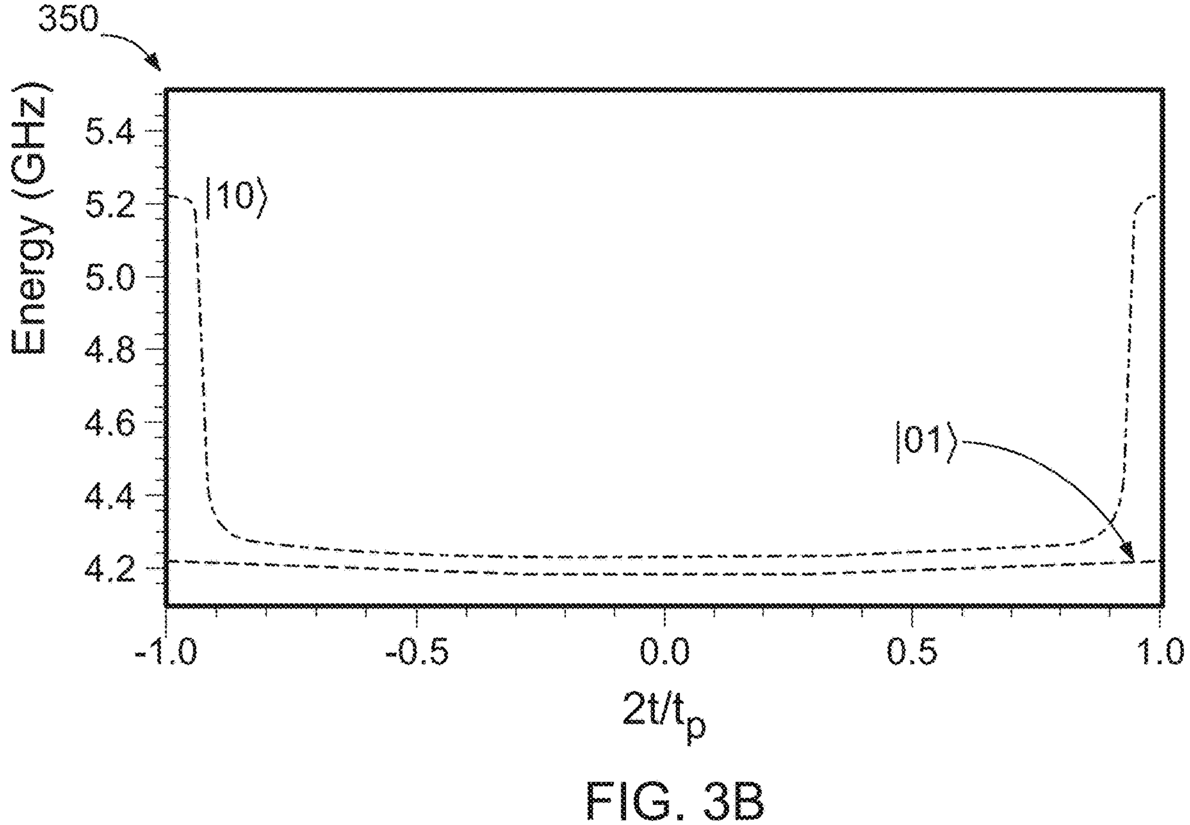
FIG. 3B shows a plot of the energy levels of two coupled Xmon qubits subject to a non-adiabatic protocol and in the SWAP manifold.

FIGS. 3A and 3B shows two plots 300, 350 of the energy levels of two coupled Xmon qubits subject to a non-adiabatic protocol. The first plot 300 shown in FIG. 3A shows energy levels in the leakage manifold. The second plot 350 shown in FIG. 3B shows energy levels in the SWAP manifold. Both plots include a horizontal axis representing dimensionless time $2t/t_p$ (where $t_p$ represents gate time) and a vertical axis representing the energy level measured in GHz.

Figure 4A:
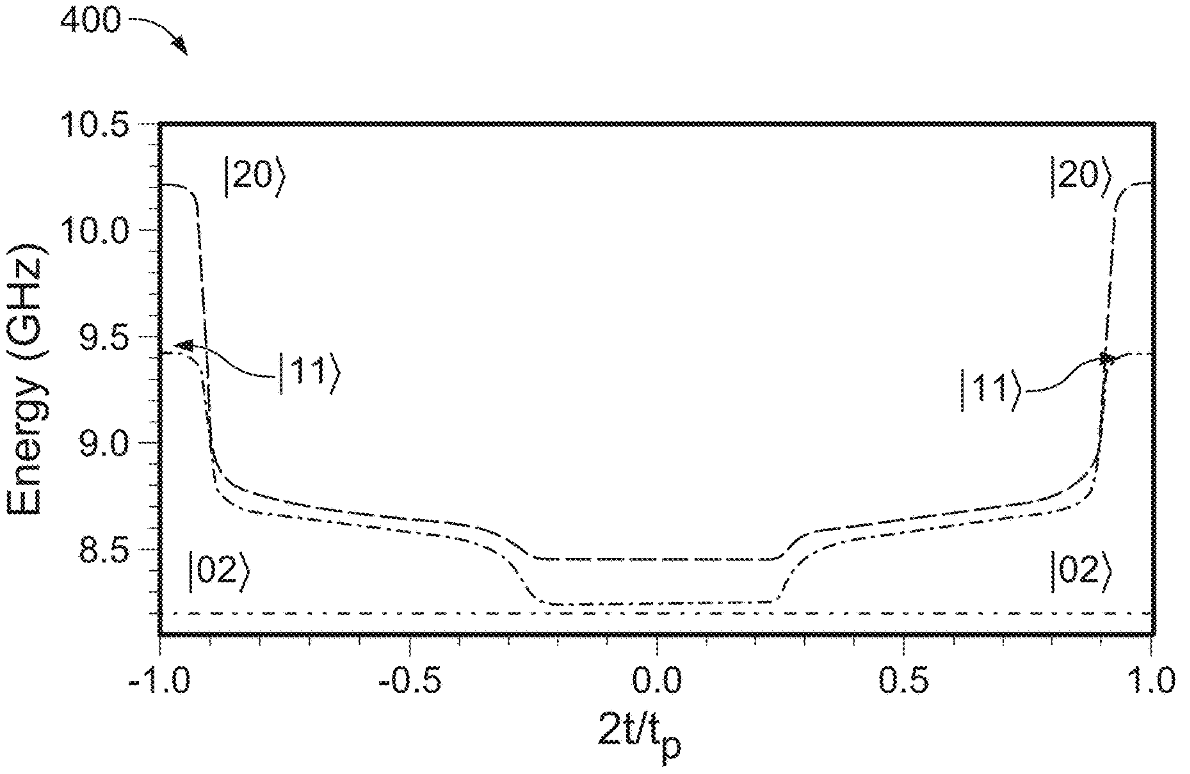
FIG. 4A shows a plot of the energy levels of two coupled Xmon qubits subject to an adiabatic protocol and in the leakage manifold.
Figure 4B:
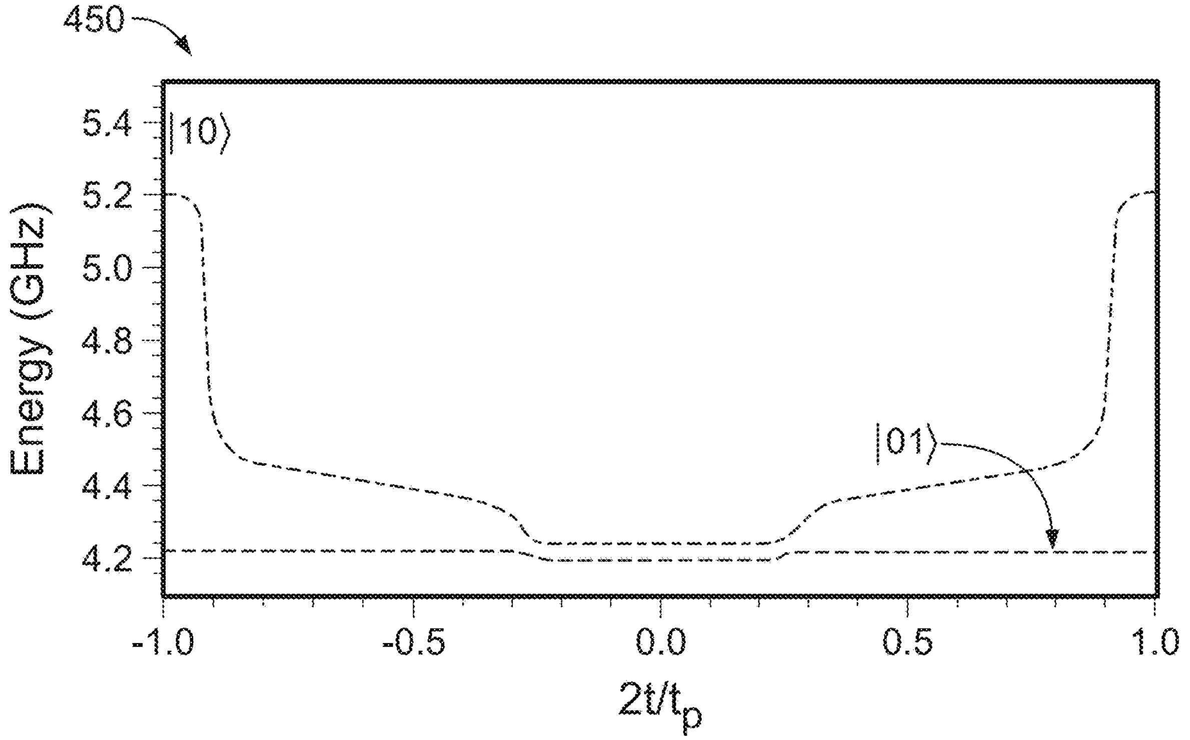
FIG. 4B shows a plot of the energy levels of two coupled Xmon qubits subject to an adiabatic protocol and in the SWAP manifold.

FIGS. 4A and 4B shows two plots 400, 450 of the energy levels of two coupled Xmon qubits subject to an adiabatic protocol. The first plot 400 shown in FIG. 4A shows energy levels in the leakage manifold. The second plot 450 shown in FIG. 4B shows energy levels in the SWAP manifold. Both plots include a horizontal axis representing dimensionless time $2t/t_p$ (where $t_p$ represents gate time) and a vertical axis representing the energy level measured in GHz.

Proposed iSWAP Gate Schedule

The proposed protocol for implementing an iSWAP gate between a first qubit and a second qubit includes a cascade schedule that defines a trajectory of a detuning between a frequency of the first qubit and a frequency of the second qubit. The cascade schedule includes multiple stages: a two stage ramp-down passage, a plateau stage, and a two-stage ramp-up passage in reverse order that preserves an overall time reversal symmetry of the protocol.

The two-stage ramp-down passage includes a first stage where the detuning between the frequency of the first qubit and the frequency of the second qubit is adiabatically driven through the avoided crossing in the leakage channel ($\in(t)=\eta$) to avoid leakage error, and a second stage where the detuning between the frequency of the first qubit and the frequency of the second qubit is driven through the avoided crossing in the SWAP channel ($\in(t)=0$) to achieve a complete population swap.

During the plateau stage (third stage) the first qubit and the second qubit are allowed to freely evolve for typical times ~10 ns.

The two-stage ramp-up passage includes a fourth stage where the second stage described above is implemented in reverse order to achieve a complete population swap in the swap channel, and a fifth stage where the first stage is implemented in reverse order to avoid leakage error. The fourth and fifth stages preserve time reversal symmetry. Example cascade schedules for implementing iSWAP gates between a first and second qubit are described in further detail below with reference to FIG. 7.

As described below in relation to FIG. 6, the cascade schedule is generated based on a trapezoidal waveform for the control angle $\theta(t)$ defining a trajectory of a frequency of the first qubit during execution of the protocol. The motion of the control vector during the proposed protocol decelerates in the middle of the ramp-down process (end of the first stage) and then accelerates again (beginning of the fifth stage). The deceleration near the avoided crossing of the leakage channel is governed by an adiabatic Rosen-Zener schedule, as described below, which results in the exponential decay of the leakage error in a broad range of the gate times.

The proposed cascade schedule for the iSWAP gate described in this specification satisfies a condition of local adiabatic evolution. This condition means that detuning between the frequency of the first qubit and frequency of the second qubit may change quickly far away from avoided crossings, i.e., for the frequencies exceeding 100 MHz distance from the point of the avoided crossing (above or below) and must slowdown in proximity to the minimum gap between energy levels, i.e., within the frequency interval ~200 MHz centered the avoided crossing frequency.

Implementing iSWAP Gates

The proposed schedule is designed to utilize adiabatic motion in the leakage channel and reduce leakage error in a broad region of gate execution time. Motivation for the design of the proposed schedule can be illustrated by considering a simplified example. Design of the proposed schedule begins by considering an effective two-level leakage Hamiltonian of equation (3) describing only |11⟩ and |20⟩ states:

$$\overline{H}_l(t) = \begin{pmatrix} \epsilon(t) & \sqrt{2}g \\ \sqrt{2}g & 2\epsilon(t) - \eta_1 \end{pmatrix} \quad (5)$$

This Hamiltonian can also be represented as $$\overline{H}_l(t) = -\frac{\omega_g(t)}{2}\begin{pmatrix} \cos\theta(t) & \sin\theta(t) \\ \sin\theta(t) & -\cos\theta(t) \end{pmatrix}, \quad (6)$$

where $\omega_g(t)=\sqrt{(\epsilon(t)-\eta_1)^2+8g^2}$ represents the time-dependent gap in the leakage channel, g represents interqubit interaction strength, the parameter $$\theta(t) = \text{arccot}\left[\frac{\epsilon(t)-\eta_1}{2\sqrt{2}g}\right] \quad (7)$$

represents the control angle between the control vector, i.e., effective magnetic field $b(t)=(2\sqrt{2}g,0,\epsilon(t)-\eta_1)$, and the z-axis on a Bloch sphere related to the two-dimensional Hilbert space spanned by the diabatic states |11⟩ and |20⟩. The control angle defines the motion of the first qubit whose frequency is varied to drive detuning during execution of the iSWAP gate.

The proposed cascade schedule for the iSWAP gate described in this specification satisfies a condition of local adiabatic evolution. This condition means that detuning between the frequency of the first qubit and frequency of the second qubit may change quickly far away from avoided crossings, i.e., for the frequencies exceeding 100 MHz distance from the point of the avoided crossing (above or below) and must slowdown in proximity to the minimum gap between energy levels, i.e., within the frequency interval ~200 MHz centered the avoided crossing frequency.

As such, the condition of the local adiabatic evolution can be broadly defined. A particular form of the local adiabatic condition that can be utilized in the proposed schedule is given by $$\langle\psi_g(t)\,|\,\partial_t\psi_e(t)\rangle = const\cdot\omega_g(t) \quad (8)$$

where $\psi_g(t)$ and $\psi_e(t)$ represent instantaneous ground and excited adiabatic eigenstates of the leakage Hamiltonian (6), respectively.

Analysis of Alternative Forward Single-Passage Schedule

Alternative methods for implementing an iSWAP gate satisfying the local adiabatic condition given by equation (8) includes implementation of a forward single-passage schedule where detuning sweeps a large energy from $\epsilon_i>0$ to $\epsilon_f<0$ and a system including the first qubit and second qubit passes the avoided crossing only once. Since the qubits do not return to their original parked states this schedule cannot be directly used in Xmon architecture but may be used in other architectures that are not constrained in this way.

The local adiabatic condition given by equation (8) and the definition of the angle θ(t) given by equation (7) imply that $\partial_t\theta(t)=$const, or $$\theta(t) = \frac{\pi}{2}\left(1+\frac{2t}{t_p}\right) \quad (9)$$

Equation (9) shows that the control vector uniformly rotates within x, z-plane starting from the North pole at $t=-t_p/2$ and ending at the South pole $t=t_p/2$ where $t_p$ represents the gate execution time. However, the magnitude of the control vector is not zero and has very sharp time dependence. As a result, the problem cannot be reduced to a time-independent Hamiltonian. Fortunately, for the time dependence given by equation (9) the problem can be solved exactly using transformation of the time-dependent Schrödinger equation to the natural time scale:

$$\tau(t) = \omega_0^{-1}\int_0^t \omega_g(s)ds, \quad (10)$$

where $\omega_0=2\sqrt{2}g$ represents the minimal gap between the (adiabatic) eigenstates of Hamiltonian (6).

Equation (10) defines a one-to-one map between the "ordinary" (or "laboratory") time t in the original Hamiltonian (6) and an artificial time variable τ describing motion in an accelerating frame of reference in which the magnitude of the effective magnetic field (control vector) is a time-independent constant. In other words, in the natural time frame the Hamiltonian of a two-level system has a constant gap $\omega_0$ and the motion of the system is determined by the dependence of the control angle on the natural time $\theta(\tau)=\theta[t(\tau)]$. Physically, $\omega_0\tau(t)$ represents the phase accumulated by the first qubit during the time interval (0,t).

The time-dependent Schrödinger equation for the leakage Hamiltonian in equation (6) is given by:

$$i\partial_t\begin{pmatrix}\Psi_0(t)\\ \Psi_1(t)\end{pmatrix} = \overline{H}_l(t)\begin{pmatrix}\Psi_0(t)\\ \Psi_1(t)\end{pmatrix} \quad (11)$$

where $\Psi_0(t)$ and $\Psi_1(t)$ represent the projection of the time-dependent state vector onto the original (time-independent) basis states |11⟩ and |20⟩. In the nomenclature adapted throughout this specification the diabatic basis states of a generic two-level system are labeled with a pair of indices (0,1), e.g., |0⟩≡|11⟩ and |1⟩≡|20⟩ in the present case or |0⟩≡|10⟩ and |1⟩≡01⟩ for the SWAP channel, while the adiabatic basis states, i.e., time-dependent eigenstates of the Hamiltonian $\overline{H}_l(t)$ in the present case or $H_s(t)$ for the SWAP channel are labeled with a pair of indices (g,e). The solution of equation (11) can be obtained using transformation to instantaneous adiabatic basis of the Hamiltonian $\overline{H}_l(t)$ defined by the time-dependent unitary matrix:

$$U(t) = \sin\left[\frac{\theta(t)}{2}\right]\sigma_x + \cos\left[\frac{\theta(t)}{2}\right]\sigma_z \quad (12)$$

where $\sigma_i$ are the Pauli matrices. Applying the unitary matrix U(t) to both sides of equation (11) and performing the natural time transformation (9) results in the transformed Schrödinger equation in the adiabatic basis and in the natural time scale:

$$i\partial_\tau\begin{pmatrix}\psi_g(\tau)\\ \psi_e(\tau)\end{pmatrix} = \frac{1}{2}\begin{pmatrix} -\omega_0 & -i\theta'(\tau) \\ i\theta'(\tau) & \omega_0 \end{pmatrix}\begin{pmatrix}\psi_g(\tau)\\ \psi_e(\tau)\end{pmatrix} \quad (13)$$

Here $\psi_{g,e}(\tau)\equiv\psi_{g,e}[t(\tau)]$ represents the components of the adiabatic wave function expressed through the natural time, and $t(\tau)$ is the solution of equation (10) for t. Equation (13) describes the motion of the two-level system with a constant gap $\omega_0$ and non-adiabatic coupling $\theta'(\tau)$.

The substitution $\psi_g(\tau)=e^{i\omega_0\tau/2}c_g(\tau)$ and $\psi_e(\tau)=e^{-i\omega_0\tau/2}c_e(\tau)$ into equation (13) leads to the system of equations for $c_{g,e}(\tau)$ given by $$c_g'(\tau) = -\frac{1}{2}e^{-i\omega_0\tau}\theta'(\tau)c_e(\tau) \tag{14a}$$

$$c_e'(\tau) = \frac{1}{2}e^{i\omega_0\tau}\theta'(\tau)c_g(\tau) \tag{14b}$$

This, in turn, can be transformed into the second order differential equation for the coefficient $c_e(\tau)$:

$$c_e''(\tau) - \left[i\omega_0 + \frac{\theta''(\tau)}{\theta'(\tau)}\right]c_e'(\tau) + \frac{1}{4}\theta'(\tau)^2 c_e(\tau) = 0 \tag{15}$$

It is assumed that at the initial moment $\tau_{in}$, the system is in the ground state, i.e., $\psi_e(\tau_{in})=\psi_e(-t_p/2)=0$, giving the initial condition $c_e(\tau_{in})=0$. Since $c_g(\tau_{in})=1$ is known, the second boundary condition for the derivative $$c_e'(\tau_{in})$$

is given by equation (14b). The leakage error is given by the probability that the system will populate the excited state at the end of the execution $\tau_f$.

$$P_e = |\psi_e(t_p/2)|^2 = |\psi_e(\tau_f)|^2 = |c_e(\tau_f)|^2. \tag{16}$$

Here the natural times $\tau_{in}$ and $\tau_f$ correspond to the beginning and the end of the gate and can be obtained from equation (10), which provides the map $(-t_p/2,t_p/2)\Leftrightarrow(\tau_{in},\tau_f)$.

From equations (7), (9) and (10) the explicit relation between the times t and $\tau$, and, ultimately, the functional dependence $\theta(\tau)$ can be found:

$$\theta(\tau) = \theta[t(\tau)] = \frac{1}{2}\left[\pi + 4\arctan\left(\tanh\left(\frac{\pi\tau}{2t_p}\right)\right)\right]. \tag{17}$$

Equations (15) and (17) can be recognized as the Rosen-Zener model, which was developed to describe a double Stern-Gerlach experiment. By initial design, the problem describes a process evolving during an infinite time interval. The Rosen-Zener problem can be solved exactly in terms of hypergeometric functions. Protocols related to this type of solution are referred to herein as "Rosen-Zener" protocols. The same solution presented below can be obtained for the finite pulse time $t_p$. This is because by virtue of equations (7) and (9), the time-dependent gap is given by $\omega_g(t)=\omega_0\sec(\pi t/t_p)$, and the integral in equation (10) diverges at $t=\pm t_p/2$, i.e. finite gate time $t_p$ maps onto the infinite time in the natural time scale: $(-t_p/2,t_p/2)\Leftrightarrow(-\infty,\infty)$.

The solution of equation (15) with $\theta(\tau)$ given by equation (17) can be obtained by replacing $\tau$ with a new variable, $z(\tau)=(\frac{1}{2})[1+\tanh(\pi\tau/t_p)]$, which changes from 0 to 1 when $\tau$ changes from $-\infty$ to $\infty$. After the change of variables equation (15) takes the form that can be recognized as a hypergeometric equation $$z(1-z)c_e''(z) - \left(z - \frac{1}{2} + i\frac{\gamma}{\pi}\right)c_e'(z) + \frac{1}{4}c_e(z) = 0, \tag{18}$$

which possess a general solution given by $$c_e(z) = A_1\cdot {}_2F_1\left(-\frac{1}{2},\frac{1}{2};\frac{1}{2}-i\frac{\gamma}{\pi};z\right) + A_2\cdot z^{1/2+i\gamma/\pi}{}_2F_1\left(1+i\frac{\gamma}{\pi}, i\frac{\gamma}{\pi}; \frac{3}{2}+i\frac{\gamma}{\pi}; z\right). \tag{19}$$

Here ${}_2F_1(p,q; r; z)$ represents hypergeometric functions, $\gamma=\omega_0 t_p/2$ represents the dimensionless gate time and the constants $A_{1,2}$ must be determined from the initial conditions. The first initial condition at z=0, $c_e(0)=0$, implies that $A_1=0$, and the second boundary condition given by equation (14b) allows determining $A_2=(1+2i\gamma/\pi)^{-1}$. As a result, the leakage error is given by a simple analytical formula:

$$P_e(\gamma) = |c_e(1)|^2 = \text{sech}^2(\gamma) \tag{20}$$

Equation (20) provides an important physical insight behind the design of the proposed protocol. As can be seen from equation (20), the probability that the cascade schedule incurs a leakage error is proportional to $4e^{-2\gamma}=4e^{-\omega_0 t_p}$ and decays exponentially at large times $t_p$. This behavior is unique since, usually, the finite time protocols result in a power-law decay of the non-adiabatic error. This can be illustrated by considering a different local adiabatic condition as compared with equation (8). For example, the condition $$\langle\psi_g(t)|\partial_t\psi_e(t)\rangle = const\cdot\omega_g^2(t)$$

also leads to the exactly solvable problem. It can be shown that the solution can be obtained by means of the same natural time transformation described above, which results in the time-independent Hamiltonian and the analytical formula for the leakage error:

$$P_e = \frac{1}{\gamma^2+1}\sin^2\left(\frac{\pi}{2}\sqrt{\gamma^2+1}\right).$$

The solution is formally similar to that of the known Rabi problem describing a spin moving under a uniformly rotating in-plane magnetic field of constant magnitude, and protocols related to solutions of this type are therefore referred to herein a "Rabi protocol". The power-law decay of the leakage error, $P_e\sim(\omega_0 t_p)^{-2}$, is slow as compared with the fast exponential decay germane to the Rosen-Zener protocol.

Figure 5:
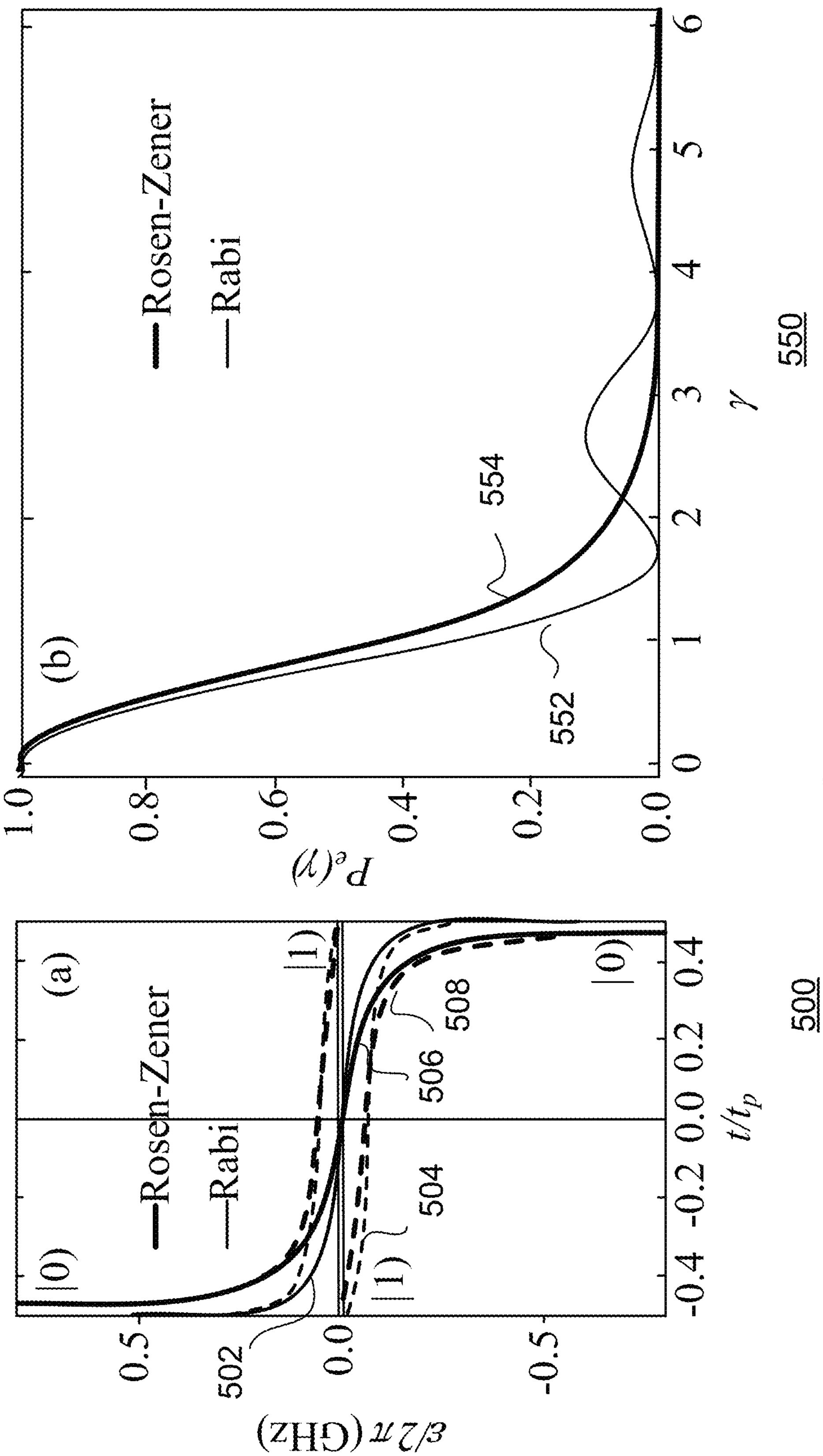
FIG. 5 shows a first plot comparing a Rabi protocol and a Rosen-Zener protocol and a second plot comparing error transition probabilities of the Rabi protocol and the Rosen-Zener protocol.

FIG. 5 shows two plots 500 and 550. The first plot 500 compares a Rabi protocol for implementing an iSWAP gate and a Rosen-Zener protocol. The second plot 550 compares the error transition probabilities of the Rabi protocol and the Rosen-Zener protocol.

Plot 500 includes a horizontal axis representing laboratory time t divided by gate time $t_p$, and a vertical axis representing detuning $\epsilon(t)/2\pi$ measured in GHz. Lines 502 and 504 represent the Rabi protocol. Lines 506 and 508 represent the presently described Rosen-Zener protocol. Dashed lines 504 and 508 represent adiabatic protocols. Solid lines 502 and 506 represent non-adiabatic protocols.

Plot 550 includes a horizontal axis representing dimensionless total duration of the iSWAP gate $\gamma$ and a vertical axis representing the probability that the cascade schedule incurs a SWAP or leakage error $P_e(\gamma)$. Line 552 represents the Rabi protocol. Line 554 represents the presently described Rosen-Zener protocol.

As shown in FIG. 5, the calculated transition probabilities for the Rabi and Rosen-Zener protocols differ. While the Rabi protocol has well defined zeros that would correspond either to a complete SWAP operation or to zero leakage, the overall behavior of the probability is highly non-adiabatic because it decays slowly, i.e. proportional to $1/(g\cdot t_p)^2$ for large t. On the other hand, the Rosen-Zener schedule probability does not reach zero but approaches zero exponentially fast. In this sense the Rosen-Zener pulse shape is the "most adiabatic schedule" since it decays faster than any power of $(\omega_0 t_p)^{-1}$. This fact provides physical motivation for the proposed protocol.

Method for Generating the Proposed "Rosen-Zener" Cascade Schedule

In what follows the time-independent diabatic basis 0 and 1 associated with the eigenstates of the Hamiltonian at initial time when the levels are very far from each other are used, since it is more convenient for numerical implementation. By the same token only return schedules compatible with Xmon architecture are considered and the gate simulations are performed within a time interval $(0,t_p)$. The main quantity of interest, $P_{01}(t_p)$, is the probability of the transition from the initial state 0 to the final state 1 at the end of the gate, $t=t_p$. In the SWAP channel $P_{01}(t_p)$ describes the probability of the population swap between the computational states $|10\rangle$ and $|01\rangle$. As such, $P_{01}(t_p)$ is the probability of successful SWAP operation and $P_s=1-P_{01}(t_p)$ represents the SWAP error. On the contrary, in the leakage channel, $P_{01}$ is the probability of a transition from the computational state $|11\rangle$ to the non-computational state $|20\rangle$ and $P_l=P_{01}(t_p)$ represents the leakage error.

Figure 6:
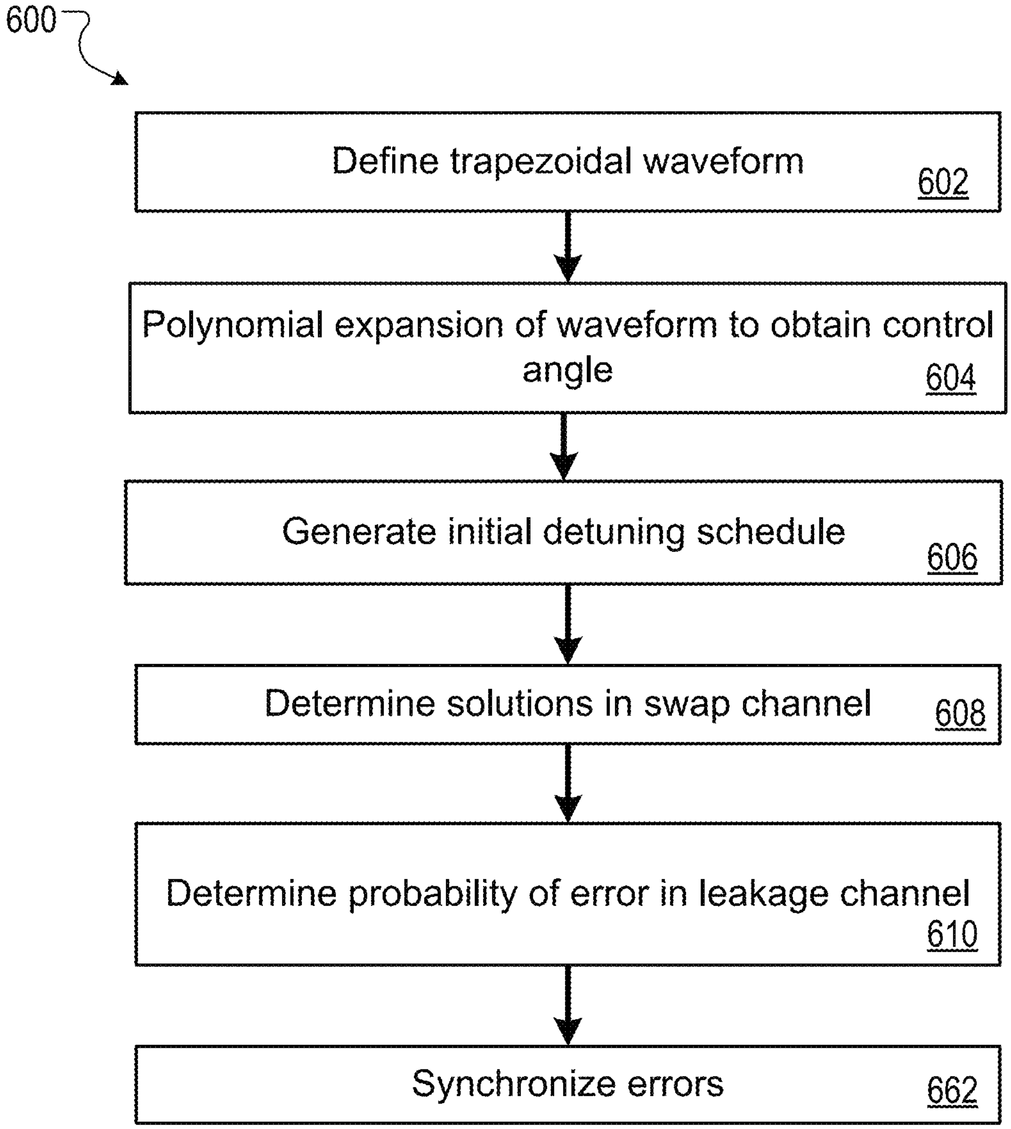
FIG. 6 is a flow diagram of an example process for implementing an iSWAP quantum logic gate between a first qubit and a second qubit according to a cascade schedule.

FIG. 6 is a flow diagram of an example process 600 for generating a cascade schedule used to implement an iSWAP quantum logic gate. For example, the process 600 may be used to generate the cascade schedules for implementing an iSWAP quantum logic gate between a first and second qubit shown in plot 750 of FIG. 7. In the following, determining the cascade schedule will be described using "laboratory time", t, though it may alternatively be performed in "natural time", $\tau$.

The cascade schedule is generated based on a trapezoidal waveform for a control angle defining a trajectory of a frequency of the first qubit during the gate execution. Generating the cascade schedule may first include defining a trapezoidal ramp function (step 602)

$$f_r(t,s)=\begin{cases}\dfrac{t}{s\cdot t_p} & 0\le t\le s\cdot t_p\\ 1 & s\cdot t_p<t<(1-s)t_p\\ 1-\dfrac{t-(1-s)t_p}{s\cdot t_p} & (1-s)t_p\le t\le t_p\end{cases}$$

where $0\le f_r(t,s)\le 1$ and the dimensionless parameter s ($0\le s\le 1/2$) controls duration of the ramp-up (or ramp-down) intervals $t_r$, such that $t_r=s\cdot t_p$ and the plateau (or "wait") time $t_W=(1-2s)\cdot t_p$. Then a trapezoidal waveform for the control angle may be generated using the ramp function $f_r(t,s)$:

$$\vartheta(t,s,\theta_{max})=\theta_{in}+(\theta_{max}-\theta_{in})f_r(t,s).$$

Here $\theta_{in}=\text{arccot}[(\epsilon(0)-\eta_1)/2\sqrt{2}g]$, $\epsilon(0)\simeq 1$ GHz represents the initial value of the detuning, and $\theta_{max}$ represents the maximum angular distance travelled by the control vector. Therefore, a simple trapezoidal waveform of the control angle is defined by the two control parameters s and $\theta_{max}$. Determining specific values of these parameters is described below with reference to step 608.

The number of the control parameters may be increased using polynomial expansion of the waveform for the control angle in terms of the generated trapezoidal ramp function (step 604):

$$\vartheta(t)=\theta_{in}+(\theta_{max}-\theta_{in})\left[c_1 f_r(t)+c_2 f_r^2(t)+\dots\right]$$

where the coefficients of the polynomial expansion $c_1, c_2, \dots$ sum to one. These coefficients along with s and $\theta_{max}$ can be obtained using a global optimization process using the fidelity as a fitness function (or gate error as a cost function.) In some implementations, one or more constraints may be applied to the coefficients {c}, such as a constraint that the ramp function be smooth (i.e., the gradients match at the boundaries of the ramp).

An initial schedule for driving the detuning between energy levels of the first qubit and second qubit using the generated polynomial expansion of the waveform for the control angle is determined (step 606) via $$\epsilon(t)=\mu+2g\cdot\lambda\cot[\vartheta(t,\{c\})]$$

with $\mu\simeq\eta_1$, representing shift, $\lambda\simeq\sqrt{2}$ representing scaling, g representing inter-qubit interaction strength, $\partial$ representing the control angle and {c} representing a set of two or more control parameters, which comprise the relative ramp-up time $s=t_r/t_p$ and the height of the trapezoid $\theta_{max}$ as the parameters {c} may further comprise the set of the polynomial coefficients $c_1, c_2, \dots$. The complete SWAP operation is possible if $\epsilon(t)$ crosses zero at the end of the second stage of the ramp-up (or ramp-down) region. This implies that $\theta_{max}$ exceeds $\theta_c=\pi-\text{arccot}[\eta/2\sqrt{2}g]$ with example values of $\eta\simeq 200$ MHz and $g\simeq 20$ MHz, $\theta_c\simeq 0.91\pi$. These values of $\theta_{max}$ are responsible for a characteristic shape of the cascade protocol.

One or more solutions in the swap channel are determined (step 608). This may include first determining a seed schedule with the minimal set of parameters s and $\theta_{max}$, which produces a complete SWAP operation in a targeted region of the gate times. Determining the seed schedule may include calculating the unitary evolution matrix for the SWAP channel. Since the cascade schedule is based on the piecewise trapezoidal waveform, the evolution matrix may be calculated by solving the Schrödinger equation within each time interval and matching the solutions at the boundaries. By eliminating the state vectors corresponding to the intermediate times, the solution is propagated from the beginning to the end of the execution. The unitary evolution matrix $U(s,\theta_{max})$ describing SWAP channel is obtained as a product of transfer matrices corresponding to each time interval. The transition probability $P_{01}(s,\theta_{max})$ can be derived from $U(s,\theta_{max})$ assuming that the system is in the state $|10\rangle$ at t=0. The condition $P_{01}(s,\theta_{max})=1$ ensures a complete population swap between the qubits. Therefore, solving equation $P_{01}(s,\theta_{max})=1$ for one of the variables, say s, gives a "perfect swap trajectory", $s(\theta_{max})$, i.e., a path in a two-dimensional parameter space $(s,\theta_{max})$ for which $P_{01}=1$. This trajectory defines the seed schedule.

In some implementations a rounding Gaussian filter may be applied to eliminate high frequencies in the pulse Fourier spectrum and avoid distortion of the pulse due to cutoff frequency in the electronic boards (DACers). In addition, the set of control parameters may be expanded by adding one or two higher order terms in the polynomial expansion of the control angle to ensure greater variational freedom during the optimization of the protocol.

The probability of an error in the leakage channel is determined (step 610). Once the seed schedule is known the Schrödinger equation can be solved for the leakage channel, e.g., in a two-level approximation by keeping only strongly interacting 11 and 20 states in the Hamiltonian of equation (3). To solve the Schrödinger equation the following representation of the state vector in the leakage manifold can be used $$|\Psi_l(t)\rangle = e^{-i\phi_l(t)}\phi_o(t)|11\rangle + e^{i\phi_l(t)}\phi_1(t)|20\rangle$$

where $$\phi_l(t) = (\gamma/2)\int_0^{2t/t_p} dx(\tilde{\epsilon}(x) - \tilde{\eta}),$$

$\tilde{\epsilon}(x)=\epsilon(x)/2g$ and $\tilde{\eta}=\eta/2g$. The functions $\phi_{0,1}$ can be found from the differential equations $$4\phi_0''(x) - 4i\gamma(\tilde{\epsilon}(x) - \tilde{\eta})\phi_0'(x) + 2\gamma^2\phi_0(x) = 0$$
$$4\phi_1''(x) + 4i\gamma(\tilde{\epsilon}(x) - \tilde{\eta})\phi_1'(x) + 2\gamma^2\phi_1(x) = 0$$

and the initial conditions $$\phi_0(0) = \cos\left(\frac{\theta_l}{2}\right),\ \phi_0'^{(0)} = -\left(\frac{i\gamma}{\sqrt{2}}\right)\sin\left(\frac{\theta_l}{2}\right),$$
$$\phi_1(0) = \sin\left(\frac{\theta_l}{2}\right),\ \phi_1'^{(0)} = -\left(\frac{i\gamma}{\sqrt{2}}\right)\cos\left(\frac{\theta_l}{2}\right)$$

where $\theta_l=\mathrm{arccot}\,[(\tilde{\epsilon}(0)-\tilde{\eta})/\sqrt{2}]$. The leakage error $P_l$ can then be calculated as $$P_l = P_{11,20}(t_p) = \left|-e^{-i\phi_l(t_p)}\sin\left(\frac{\theta_s}{2}\right)\phi_0(2) + e^{i\phi_l(t_p)}\cos\left(\frac{\theta_s}{2}\right)\phi_1(2)\right|^2 \quad (14)$$

The SWAP channel can be treated similarly using the representation $|\Psi_s(t)\rangle = e^{-i\phi_s(t)}\chi_0(t)|10\rangle + e^{i\phi_s(t)}\chi_1(t)|01\rangle$ in the swap manifold to obtain a SWAP error $P_s$ given by $$P_s = 1 - P_{10,01}(t_p) = 1 - \left|-e^{-i\phi_s(t_p)}\sin\left(\frac{\theta_s}{2}\right)\chi_0(2) + e^{i\phi_s(t_p)}\cos\left(\frac{\theta_s}{2}\right)\chi_1(2)\right|^2 \quad (15)$$

Figure 9:
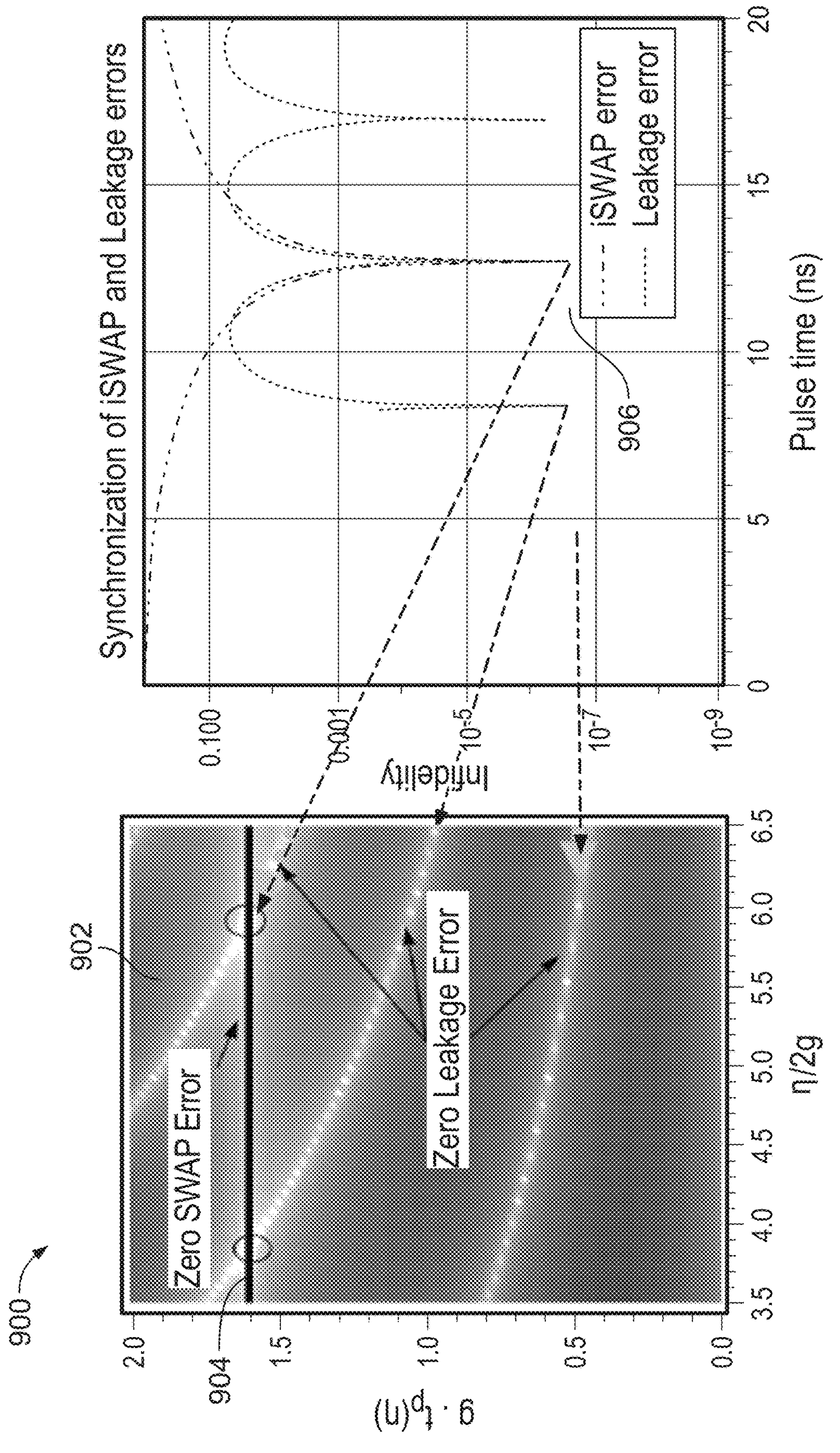
FIG. 9 shows example synchronizations of leakage and SWAP errors.
Figure 10A:
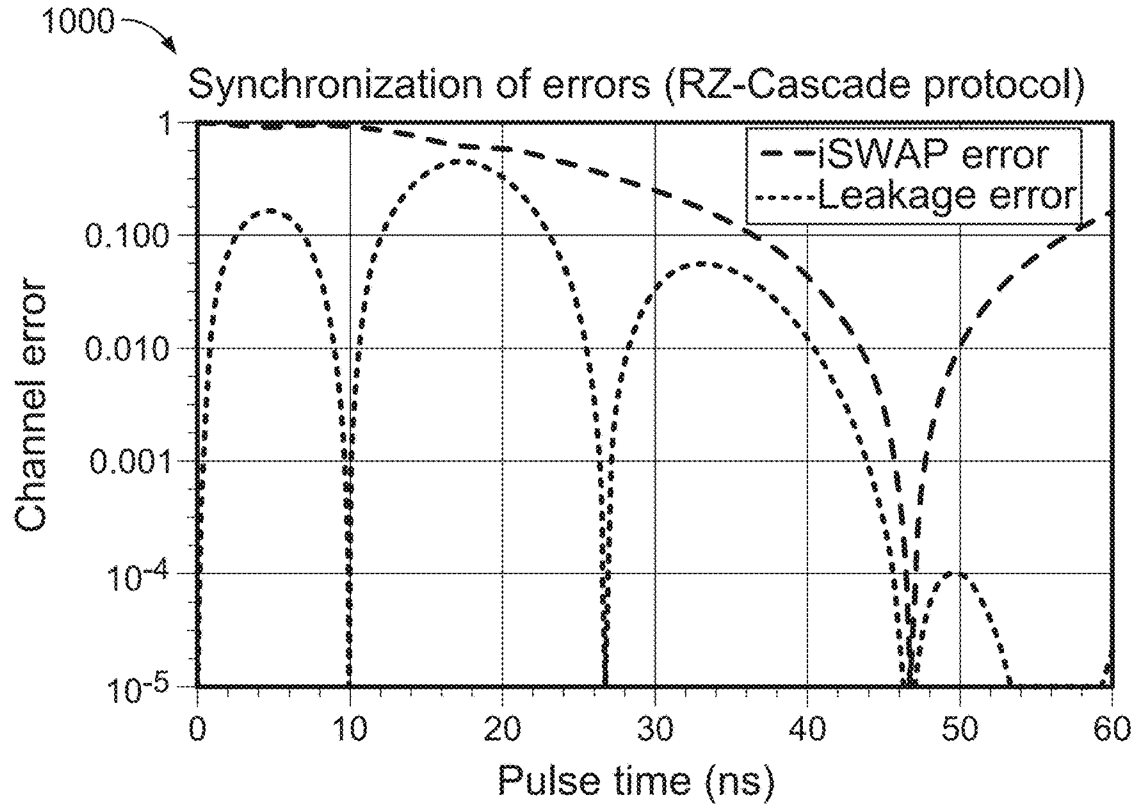
FIG. 10A is a plot that shows exponential decay of the leakage error in an example synchronization of leakage and SWAP errors for a cascade schedule generated using a Rosen-Zener protocol.
Figure 10B:
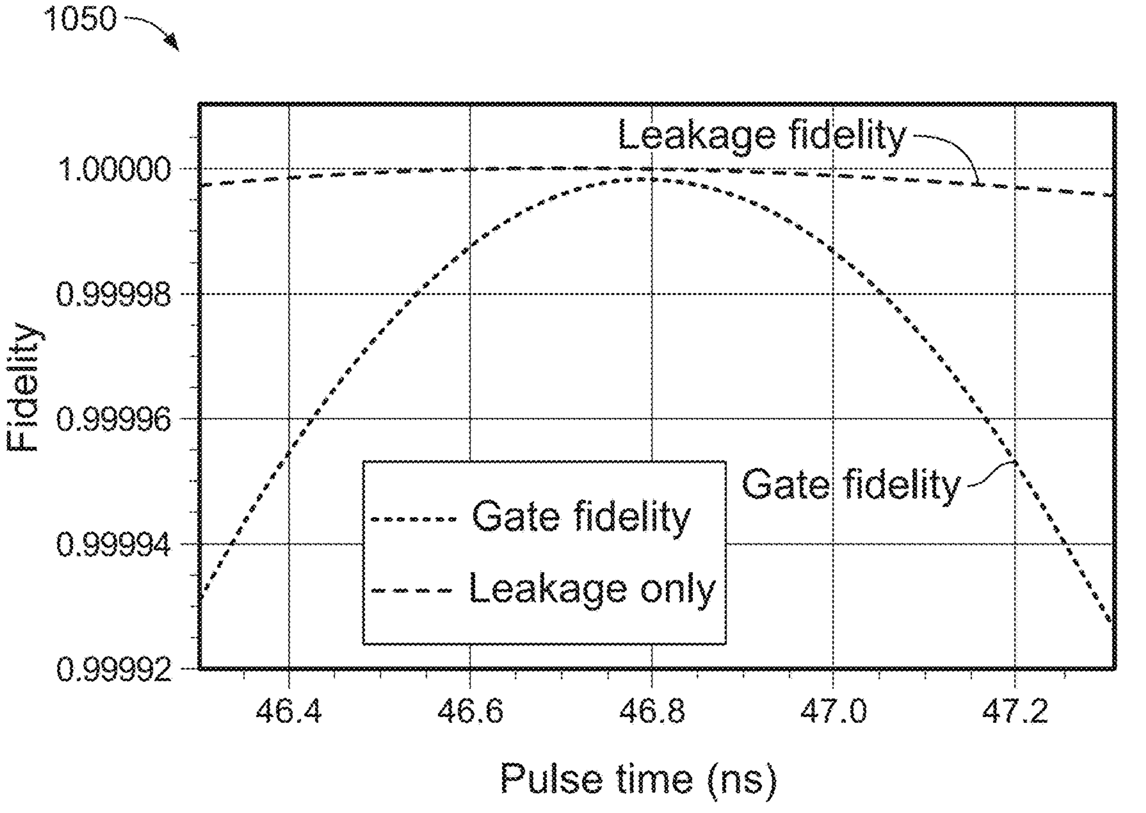
FIG. 10B is a plot that shows a fidelity of the gate enabled by the cascade schedule generated using the Rosen-Zener protocol.

The initial schedule for driving the detuning is adjusted by synchronizing the one or more solutions in the swap channel and the probability of an error in the leakage channel (step 662). Synchronizing the solutions in the SWAP channel and the probability of an error in the leakage channel may include selecting a solution in the SWAP channel that, when combined with the probability of an error in the leakage channel, achieves acceptable swap gate fidelity. Values of parameters in the selected solution may then be applied to the initial schedule for driving the detuning to generate the cascade schedule. Example synchronizations of leakage and swap errors are illustrated in FIGS. 9, 10A, and 10B.

In some cases, parameter values of the cascade schedule may be further adjusted using gate fidelity as a fitness function (or gate error as a cost function.) To determine the fidelity of an iSWAP gate implemented using the proposed Rosen-Zener cascade schedule, defined by the unitary operator $U \equiv U(t_p)$ an ideal (or target) iSWAP gate $U_t$ operating in the entire two-qubit Hilbert space. The average fidelity $F(U; U_t)$ can then be calculated as $$F(U; U_t) = \frac{1}{d+1}\left(\frac{1}{d^2}\sum_j Tr\left(U_t U_j^\dagger U_t^\dagger U U_j U^\dagger\right) + 1\right) \quad (16)$$

where d represents the dimension of the Hilbert space, and $U_j/\sqrt{d}$ represents the orthonormal set of unitary operators, which forms a basis in the $d^2$-dimensional space of d×d unitary matrices. The orthonormality condition is defined as $$TrU_i^\dagger U_j = d\delta_{ij}.$$

In this case, due to the conservation of the total number of excitations, the state vector is confined within a 6-dimensional space spanned by four computational states 00, 10, 01, 11 and two non-computational states 20, 02. As such, the target iSWAP gate can be defined as $$U_t = \begin{pmatrix} 1 & 0 & 0 & 0 & 0 & 0 \\ 0 & 0 & -i & 0 & 0 & 0 \\ 0 & -i & 0 & 0 & 0 & 0 \\ 0 & 0 & 0 & e^{i\phi} & 0 & 0 \\ 0 & 0 & 0 & 0 & e^{-i\phi} & 0 \\ 0 & 0 & 0 & 0 & 0 & 1 \end{pmatrix} \quad (17)$$

The basis $\{U_j\}$ can be chosen. Usually, it is chosen to be consistent with the nature of actual physical systems that perform computations. Since physical systems performing computations are typically qutrits (three-level systems) rather than qubits in state of the art quantum computing architecture, a natural choice is to use direct products of Gell-Mann matrices or, since the Hilbert space is 6-dimensional, to utilize (properly normalized) generalized Gell-Mann matrices $\lambda_j$ that span the Lie algebra of the SU(6)

group. As an example, using the latter option generates a 36-element set comprised of 35 matrices $$U_j = \left(\frac{d}{2}\right)\lambda_j$$

plus the 6×6 unit matrix. Using this procedure and equations (16) and (17) obtains the following expression for the average fidelity:

$$F = \frac{1}{21}\left[9 - 2(P_s + P_l) + 4\left(\sqrt{1-P_l} + \sqrt{1-P_s} + \sqrt{(1-P_l)(1-P_s)}\right]\right.$$

where $P_s$ and $P_l$ are the SWAP and leakage errors defined above in equations (14) and (15). This expression for the fidelity can be used as a fitness function to adjust values of the parameters of the cascade schedule.

Alternatively, or in addition hardware testing and randomized benchmarking techniques may be performed to determine further adjustments to the generated cascade schedule, e.g., adjustments that further increase the iSWAP gate fidelity.

The cascade schedule is then implemented using the generated schedule. Implementing the cascade schedule includes, during a first stage, adiabatically driving detuning between the frequency of the first qubit and the frequency of the second qubit through a first avoided crossing in a leakage channel; during a second stage, driving detuning between the frequency of the first qubit and the frequency of the second qubit through a second avoided crossing in a swap channel; during a third stage, evolving the first qubit and second qubit; during a fourth stage, implementing the second stage in reverse order; and during a fifth stage, implementing the first stage in reverse order.

Figure 7:
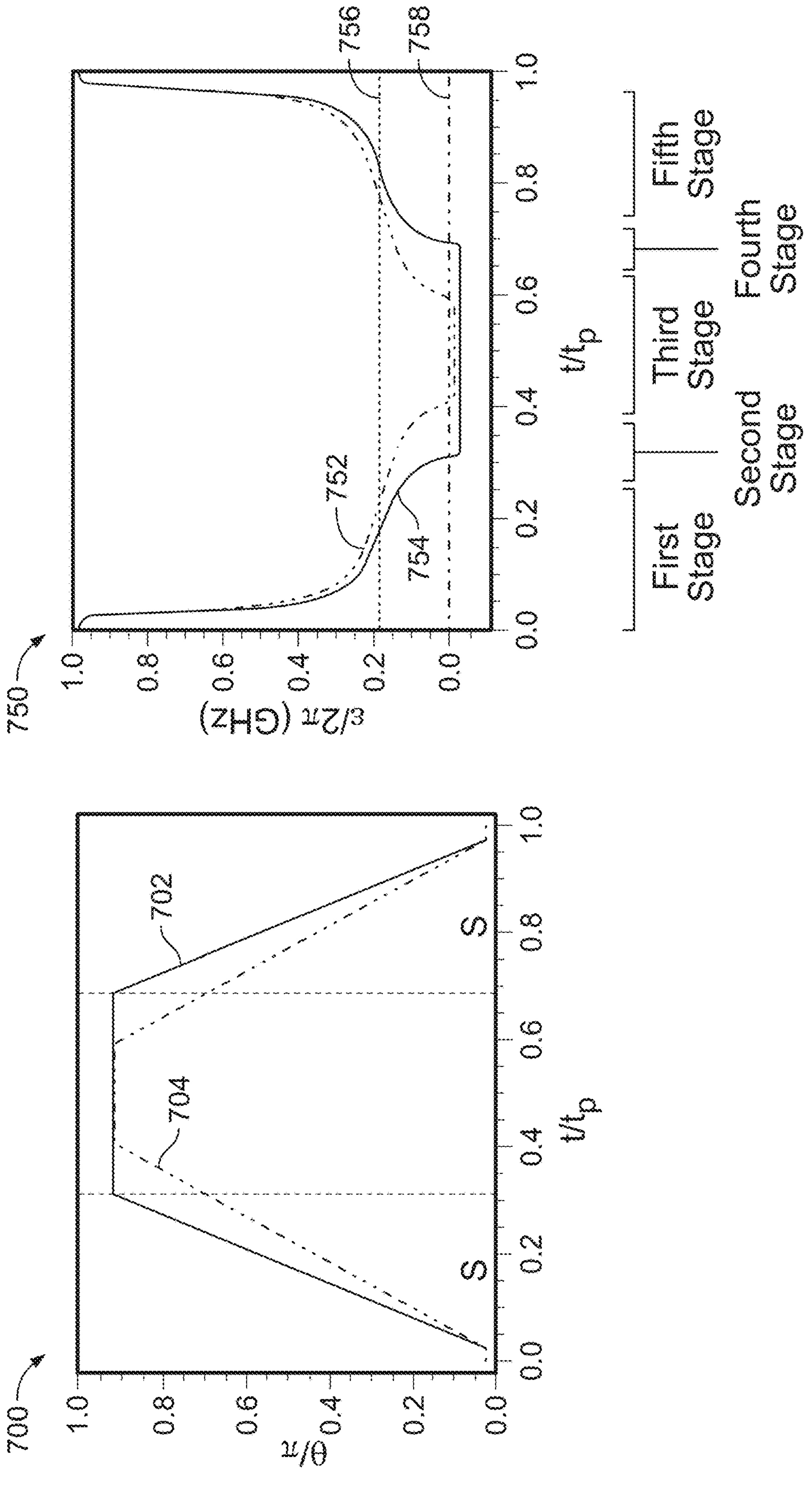
FIG. 7 shows two example cascade schedules.

FIG. 7 shows two example cascade schedules generated using the process 600 for implementing an iSWAP quantum logic gate between a first qubit and a second qubit described with reference to FIG. 6. The first plot 700 in FIG. 7 shows two trapezoidal waveforms $\vartheta(t)$ In the first trapezoidal waveform 702 the parameters s and $\theta_{max}$ take values s=0.3 and $\theta_{max}$=0.917π. In the second trapezoidal waveform 704 the parameters s and $\theta_{max}$ take values s=0.4 and $\theta_{max}$=0.91π. The second plot 750 in FIG. 7 shows two cascade schedules $\epsilon(t)$ corresponding to the two trapezoidal ramp functions. The first cascade schedule 752 corresponds to the first trapezoidal ramp function 702. The second cascade schedule 754 corresponds to the second trapezoidal ramp function 704. The values of μ and λ in both cascade schedules are set to μ=η, λ=√2. Plot 750 also shows avoided crossing in the SWAP channel ($\epsilon$=0) 758 and avoided crossing in the leakage channel ($\epsilon$=η) 756. Representations of the five stages described with reference to FIG. 6 are shown in FIG. 7. However, these representations are example representations and for illustrative purposes only.

Figure 8:
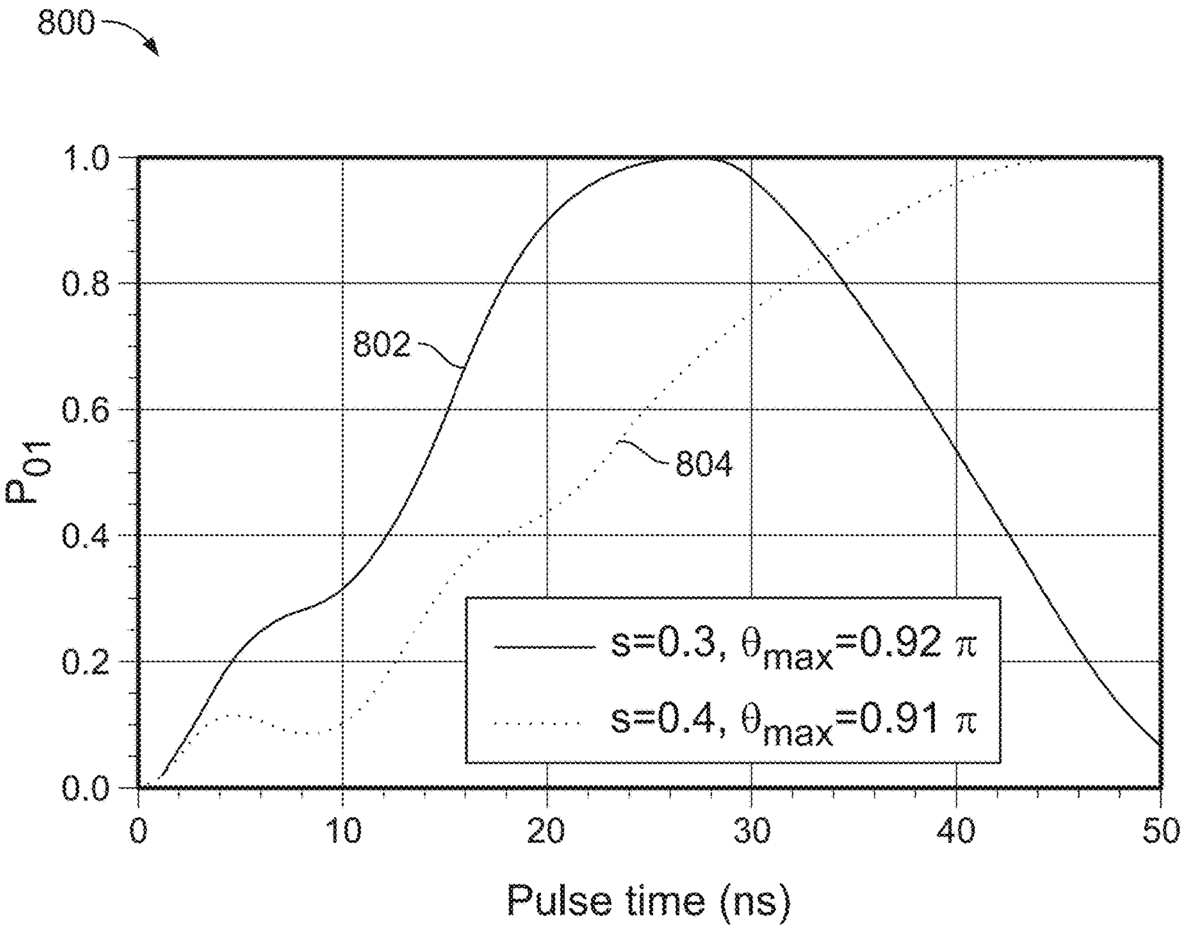
FIG. 8 shows a plot of the probabilities of interqubit population swap for two example cascade schedules.

FIG. 8 shows a plot 800 of the probabilities of interqubit population swap for the two example cascade schedules illustrated in FIG. 7. Line 802 corresponds to probabilities of interqubit population swap for the cascade schedule with s=0.3 and $\theta_{max}$=0.917π. Line 804 corresponds to probabilities of interqubit population swap for the cascade schedule with s=0.4 and $\theta_{max}$=0.91π.

FIG. 8 shows how the behavior of $P_{01}$ for both schedules drastically differs in terms of the positions of the maxima, their width and general shape. However, in both cases a complete SWAP operation is attainable. The general trend is that shrinking the trapezoidal base produces longer gates, as expected. On the other hand, the longer gates are more adiabatic and, in turn, more stable.

FIG. 9 shows an example synchronization of leakage and SWAP errors. The dotted lines 902 represent gate times corresponding to zero leakage. The horizontal line 904 represents the gate time $t_p$ such that $P_s(t_p)$=0. As shown in FIG. 9, the gate time can be chosen to satisfy $P_s(t_p)\cong P_l(t_p)\cong 0$ at the third zero of leakage error 906.

FIGS. 10A and 10B shows example synchronizations of leakage and SWAP errors for a cascade schedule generated using a Rosen-Zener protocol with low sensitivity to gate time error. The first plot 1000 shown in FIG. 10A shows exponential decay of the leakage error 1002. The second plot 1050 shown in FIG. 10B shows the calculated fidelity of the gate enabled by the protocol. The calculated fidelity shows a very low loss of fidelity. The seeming fidelity loss is predominantly due to (also very small) deviation of the SWAP angle from π/2. Since the latter is not very important for the quantum supremacy experiments this protocol could be a viable candidate for a fast an efficient hardware implementation.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively, or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on its software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g., photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A method for implementing an iSWAP quantum logic gate between a first qubit and a second qubit, the method comprising:

synchronizing errors in a swap channel and a leakage channel, comprising selecting a solution in the swap channel that, when combined with a probability of an error in the leakage channel, achieves a predetermined swap gate fidelity and applying values of parameters in the selected solution to an initial schedule for driving a detuning between a frequency of the first qubit and a frequency of the second qubit to generate a cascade schedule; and implementing the cascade schedule, comprising:

adiabatically driving the detuning between the frequency of the first qubit and the frequency of the second qubit through a first avoided crossing in the leakage channel; and driving the detuning between the frequency of the first qubit and the frequency of the second qubit through a second avoided crossing in the swap channel.

2. The method of claim 1, wherein the leakage channel comprises a manifold spanned by a computational state 11 and two non-computational states 02 and 20.

3. The method of claim 1, wherein driving the detuning between the frequency of the first qubit and the frequency of the second qubit through the first avoided crossing in the leakage channel comprises driving the detuning between the frequency of the first qubit and the frequency of the second qubit through state 11-20 resonance.

4. The method of claim 1, wherein the swap channel comprises a manifold spanned by computational states 10 and 01.

5. The method of claim 1, wherein the driving detuning between the frequency of the first qubit and the frequency of the second qubit through the second avoided crossing in a swap channel comprises driving the detuning between the frequency of the first qubit and the frequency of the second qubit through state 10-01 resonance.

6. The method of claim 1, further comprising:

defining a trapezoidal ramp function in laboratory time;

generating a polynomial expansion of a waveform for a control angle that defines a trajectory of the frequency of the first qubit during execution of the iSWAP quantum logic gate in terms of the trapezoidal ramp function;

generating the initial schedule for driving the detuning between the frequency of the first qubit and the frequency of the second qubit using the generated polynomial expansion of the waveform for the control angle.

7. The method of claim 6, wherein the trapezoidal ramp function is a function of maximum control angle, pulse duration, length of upward ramp, and length of downward ramp.

8. The method of claim 6, wherein the trapezoidal ramp function takes values that are less than or equal to one.

9. The method of claim 6, wherein coefficients of the polynomial expansion sum to one.

10. The method of claim 6, wherein generating the initial schedule optionally further comprises applying a Gaussian filter.

11. The method of claim 6, the detuning is parameterized as $\in(t)=\mu+2g\cdot\lambda\ \cot[\Theta(t,\{c\})]$ with $\mu$ representing shift, $\lambda$ representing scaling, g representing interqubit interaction strength, $\Theta$ representing the polynomial expansion and c representing a set of two or more variational parameters.

12. The method of claim 1, wherein the cascade schedule satisfies a local adiabatic evolution condition.

13. The method of claim 12, wherein the local adiabatic evolution condition is given by $\langle\Psi_g(t)|\partial_t\Psi_e(t)\rangle$ const$\cdot\omega_g(t)$ or $\partial_t\theta(t)$=const, where $\Psi_g(t)$ and $\Psi_e(t)$ represent instantaneous adiabatic eigenstates of an effective Hamiltonian describing the leakage channel, $\theta(t)$ represents a control angle, and $\omega_g(t)=\sqrt{(\in[\![(t)-\eta_1)]\!]^2+8g^2}$ represents a time dependent gap for the Hamiltonian describing the leakage channel, with $\in(t)$ representing the detuning between the frequency of the first qubit and the frequency of the second qubit, $\eta_1$ representing an anharmonicity parameter of the first qubit, and g representing interqubit interaction strength.

14. The method of claim 1, further comprising adjusting parameter values of the cascade schedule using gate fidelity as a fitness function.

15. The method of claim 1, further comprising performing hardware testing and randomized benchmarking techniques to adjust the generated cascade schedule.

16. The method of claim 1, wherein the first qubit and second qubit comprise capacitively coupled Xmon qubits.

17. The method of claim 1, wherein a control angle that defines a trajectory of the frequency of the first qubit during execution of the iSWAP quantum logic gate comprises an angle between an effective magnetic field and a z-axis on a Bloch sphere of a system comprising the first qubit and the second qubit.

18. An apparatus comprising:

a classical processor configured to perform operations for generating a cascade schedule for implementations of an iSWAP quantum logic gate, the operations comprising:

synchronizing errors in a swap channel and a leakage channel to generate a cascade schedule for driving a detuning between a frequency of a first qubit and a frequency of a second qubit, comprising:

selecting a solution in the swap channel that, when combined with a probability of an error in the leakage channel, achieves a predetermined swap gate fidelity; and applying values of parameters in the selected solution to an initial schedule for driving the detuning between a frequency of the first qubit and a frequency of the second qubit;

the first qubit;

the second qubit, wherein the second qubit is coupled to the first qubit;

control electronics comprising one or more control devices that tune the frequency of the first qubit and the frequency of the second qubit through application of respective control signals, wherein the control electronics are configured to implement the cascade schedule by:

adiabatically driving the detuning between the frequency of the first qubit and the frequency of the second qubit through a first avoided crossing in the leakage channel; and driving the detuning between the frequency of the first qubit and the frequency of the second qubit through a second avoided crossing in the swap channel.

19. The apparatus of claim 18, wherein driving the detuning between the frequency of the first qubit and the frequency of the second qubit through the first avoided crossing in the leakage channel comprises driving the detuning between the frequency of the first qubit and the frequency of the second qubit through state 11-20 resonance.

20. The apparatus of claim 18, wherein the driving detuning between the frequency of the first qubit and the frequency of the second qubit through the second avoided crossing in a swap channel comprises driving the detuning between the frequency of the first qubit and the frequency of the second qubit through state 10-01 resonance.

* * * * *